(12) United States Patent
Chen et al.

(10) Patent No.: US 9,613,665 B2
(45) Date of Patent: Apr. 4, 2017

(54) METHOD FOR PERFORMING MEMORY INTERFACE CONTROL OF AN ELECTRONIC DEVICE, AND ASSOCIATED APPARATUS

(71) Applicant: MEDIATEK INC., Hsin-Chu (TW)

(72) Inventors: Shang-Pin Chen, Hsinchu County (TW); Bo-Wei Hsieh, Tainan (TW)

(73) Assignee: MEDIATEK INC., Hsin-Chu (TW)

( * ) Notice: Subject to any disclaimer, the term of this patent is extended or adjusted under 35 U.S.C. 154(b) by 331 days.

(21) Appl. No.: 14/535,299

(22) Filed: Nov. 6, 2014

(65) Prior Publication Data

US 2015/0255129 A1 Sep. 10, 2015

Related U.S. Application Data

(60) Provisional application No. 61/948,569, filed on Mar. 6, 2014.

(51) Int. Cl.
*G11C 7/10* (2006.01)
*G06F 1/10* (2006.01)
*G06F 1/08* (2006.01)
*G06F 1/04* (2006.01)
*G11C 7/22* (2006.01)
*H03L 7/081* (2006.01)
*H03L 7/099* (2006.01)

(52) U.S. Cl.
CPC ............ *G11C 7/1072* (2013.01); *G06F 1/04* (2013.01); *G06F 1/08* (2013.01); *G06F 1/10* (2013.01); *G11C 7/1066* (2013.01); *G11C 7/1093* (2013.01); *G11C 7/222* (2013.01); *H03L 7/0812* (2013.01); *H03L 7/0994* (2013.01); *H03L 2207/50* (2013.01)

(58) Field of Classification Search
CPC ..... G06F 1/04; G06F 1/08; G06F 1/10; G06F 1/12; G11C 7/1066; G11C 7/1072; G11C 7/1093; G11C 7/222
USPC ........................................ 713/400, 401, 503
See application file for complete search history.

(56) References Cited

U.S. PATENT DOCUMENTS

| | | | | |
|---|---|---|---|---|
| 7,535,933 B2* | 5/2009 | Zerbe | ........................ | G06F 1/10 370/516 |
| 2002/0140473 A1* | 10/2002 | Lau | .......................... | G11C 7/22 327/158 |
| 2013/0111256 A1* | 5/2013 | Kim | .................... | G06F 13/1689 713/501 |

(Continued)

*Primary Examiner* — Dennis M Butler
(74) *Attorney, Agent, or Firm* — Winston Hsu; Scott Margo

(57) ABSTRACT

A method for performing memory interface control of an electronic device and an associated apparatus are provided, where the method includes the steps of: when it is detected that a phase difference between a data signal and a clock signal reaches a predetermined value, controlling the clock signal to switch from a first frequency to a second frequency, wherein both of the clock signal and the data signal are signals of a memory interface circuit of the electronic device, and the memory interface circuit is arranged for controlling a random access memory (RAM) of the electronic device; applying at least one phase shift to the data signal until a condition is satisfied; and controlling the clock signal to switch from the second frequency to the first frequency; wherein the memory interface circuit is calibrated with aid of the at least one phase shift.

21 Claims, 15 Drawing Sheets

(56) References Cited

U.S. PATENT DOCUMENTS

2013/0262791 A1* 10/2013 Henderson .............. G06F 1/324
　　　　　　　　　　　　　　　　　　　　　711/154
2013/0301368 A1* 11/2013 Bansal ................... G11C 7/222
　　　　　　　　　　　　　　　　　　　　　365/194

* cited by examiner

US 9,613,665 B2

METHOD FOR PERFORMING MEMORY INTERFACE CONTROL OF AN ELECTRONIC DEVICE, AND ASSOCIATED APPARATUS

CROSS REFERENCE TO RELATED APPLICATIONS

This application claims the benefit of U.S. Provisional Application No. 61/948,569, which was filed on Mar. 6, 2014, and is included herein by reference.

BACKGROUND

The present invention relates to timing control of signals between a system on chip (SoC, which may be referred to as SOC) architecture and a memory chip thereof, and more particularly, to a method for performing memory interface control of an electronic device, and an associated apparatus.

According to the related art, semiconductor chips may be put together and packed into the same package, in order to reduce the size of a printed circuit board (PCB) and/or the size of an electronic device. Taking the SoC architecture as an example, the semiconductor chips may comprise a SoC chip having some memory interface terminals near the four sides of the SoC chip, and may further comprise a random access memory (RAM) chip having some memory interface terminals near the four sides of the RAM chip. Based on the conventional design, the RAM chip may be put on the SoC chip, and the memory interface terminals of the RAM chip may be electrically connected to the memory interface terminals of the SoC chip through soldering. However, some problems may occur. For example, different lengths of paths may cause skew issues. More particularly, in a situation where the difference between the lengths of two paths reaches thousands of micrometers, for example, timing alignment may be very difficult. Thus, a novel method is required for enhancing memory interface control of an electronic device having multiple semiconductor chips that are packed together, in order to guarantee the overall performance thereof.

SUMMARY

It is therefore an objective of the claimed invention to provide a method for performing memory interface control of an electronic device, and an associated apparatus, in order to solve the above-mentioned problems.

It is another objective of the claimed invention to provide a method for performing memory interface control of an electronic device, and an associated apparatus, in order to guarantee the overall performance of the electronic device.

According to at least one preferred embodiment, a method for performing memory interface control of an electronic device is provided, where the method comprises the steps of: when it is detected that a phase difference between a data signal and a clock signal reaches a predetermined value, controlling the clock signal to switch from a first frequency to a second frequency, wherein both of the clock signal and the data signal are signals of a memory interface circuit of the electronic device, and the memory interface circuit is arranged for controlling a random access memory (RAM) of the electronic device; applying at least one phase shift to the data signal until a condition is satisfied, wherein the at least one phase shift is applied to the data signal after the clock signal switches from the first frequency to the second frequency; and controlling the clock signal to switch from the second frequency to the first frequency, wherein the clock signal switches from the second frequency to the first frequency after the at least one phase shift is applied to the data signal; wherein the memory interface circuit is calibrated with aid of the at least one phase shift.

According to at least one preferred embodiment, an apparatus for performing memory interface control of an electronic device is provided, where the apparatus comprises at least one portion of an electronic device. The apparatus comprises a memory interface circuit and a controller, where the memory interface circuit is positioned in an integrated circuit (IC) of the electronic device, and the controller is coupled to the memory interface circuit and is positioned in the IC. The memory interface circuit is arranged for controlling a RAM of the electronic device, wherein signals of the memory interface circuit comprises a clock signal and a data signal. In addition, when it is detected that a phase difference between the data signal and the clock signal reaches a predetermined value, the controller controls the clock signal to switch from a first frequency to a second frequency, and applies at least one phase shift to the data signal until a condition is satisfied, wherein the at least one phase shift is applied to the data signal after the clock signal switches from the first frequency to the second frequency. Additionally, the controller controls the clock signal to switch from the second frequency to the first frequency, wherein the clock signal switches from the second frequency to the first frequency after the at least one phase shift is applied to the data signal. More particularly, the controller may calibrate the memory interface circuit with aid of the at least one phase shift.

According to at least one preferred embodiment, an apparatus for performing memory interface control of an electronic device is provided, where the apparatus comprises at least one portion of an electronic device. The apparatus comprises a plurality of clock buffer pairs and a phase detector, where the plurality of clock buffer pairs is electrically connected in series and is positioned in a memory interface circuit of an IC of the electronic device, and the phase detector is coupled to the plurality of clock buffer pairs and is positioned in the IC. In addition, each clock buffer pair of the plurality of clock buffer pairs comprises two clock buffers that are arranged in different directions. More particularly, one of the two clock buffers is positioned on an ordinary transmission path for distributing a reference clock signal of the IC toward a RAM of the electronic device, and another of the two clock buffers is positioned on an extraordinary transmission path for being used as a route back path adjacent to the ordinary transmission path during calibration of the memory interface circuit, where an end of the ordinary transmission path is utilized as beginning of the extraordinary transmission path. Additionally, the phase detector is arranged to perform phased detection on the reference clock signal obtained from the extraordinary transmission path, to calibrate the memory interface circuit according to distribution time of the reference clock signal. As a result of adjusting the timing of the reference clock signal with aid of the plurality of clock buffer pairs, clock deskew of the reference clock signal can be performed.

According to at least one preferred embodiment, a method for performing memory interface control of an electronic device is provided, where the method comprises the steps of: utilizing a plurality of clock buffer pairs to transmit a reference clock signal of an IC of the electronic device, the plurality of clock buffer pairs being electrically connected in series and positioned in a memory interface circuit of the IC, wherein each clock buffer pair of the plurality of clock buffer pairs comprises two clock buffers that are arranged in different directions, one of the two clock buffers is positioned on an ordinary transmission path for distributing the reference clock signal of the IC toward a RAM of the electronic device, another of the two clock buffers is positioned on an extraordinary transmission path for being used as a route back path adjacent to the ordinary transmission path during calibration of the memory interface circuit, and an end of the ordinary transmission path is utilized as beginning of the extraordinary transmission path; and utilizing a phase detector in the IC to perform phased detection on the reference clock signal obtained from the extraordinary transmission path, to calibrate the memory interface circuit according to distribution time of the reference clock signal. As a result of adjusting the timing of the reference clock signal with aid of the plurality of clock buffer pairs, clock deskew of the reference clock signal can be performed.

It is an advantage of the present invention that the present invention method and the associated apparatus can properly resolve the skew issues. In addition, the present invention method and the associated apparatus can perform timing alignment for paths having different lengths with ease, without introducing any side effect (e.g. complicated circuitry). More particularly, in a situation where the difference between the lengths of two paths reaches thousands of micrometers, for example, timing alignment can be performed correctly. Additionally, the present invention method and the associated apparatus can guarantee the overall performance of the electronic device.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
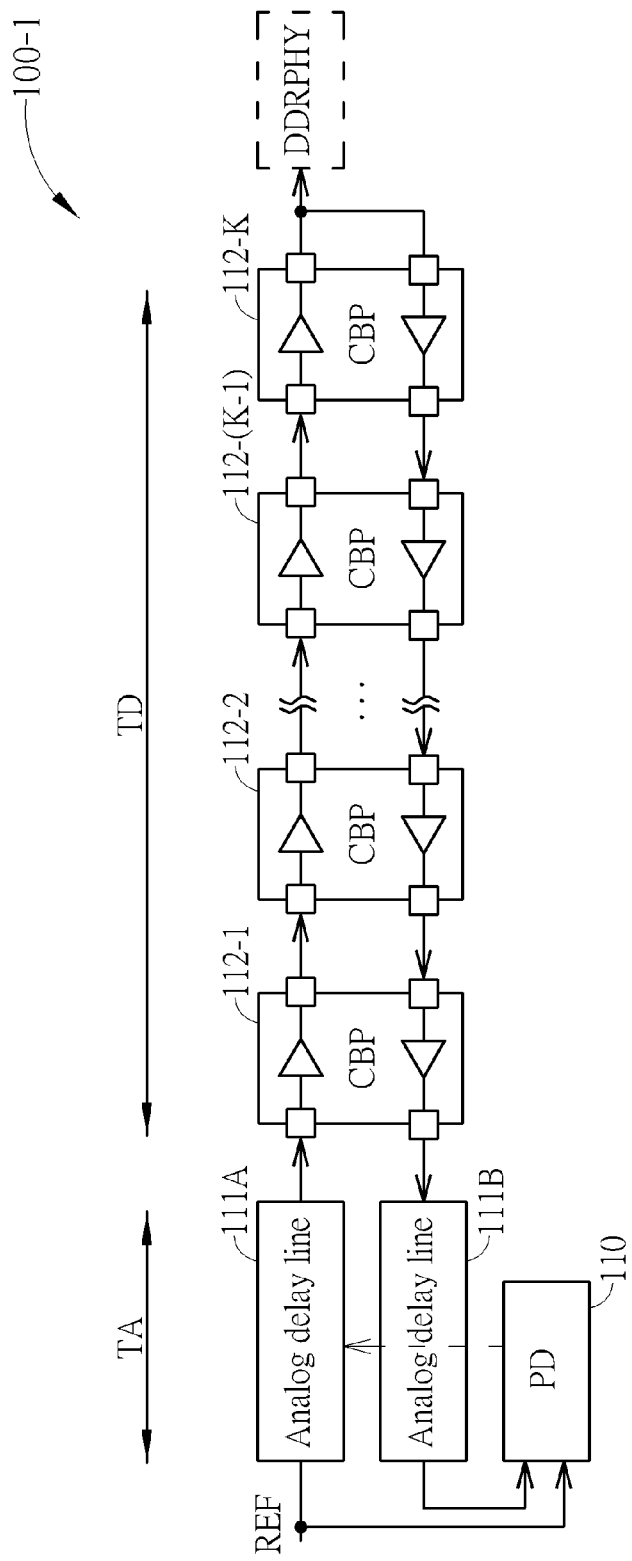
FIG. 1 is a diagram of an apparatus for performing memory interface control of an electronic device according to an embodiment of the present invention.

Please refer to FIG. 1, which illustrates a diagram of an apparatus 100-1 for performing memory interface control of an electronic device according to an embodiment of the present invention, where the apparatus 100-1 comprises at least one portion (e.g. a portion or all) of an electronic device. For example, the apparatus 100-1 may comprise a portion of the electronic device mentioned above, and more particularly, can be at least one hardware circuit such as at least one integrated circuit (IC) within the electronic device. In another example, the apparatus 100-1 can be the whole of the electronic device mentioned above. In another example, the apparatus 100-1 may comprise a system comprising the electronic device mentioned above (e.g. an audio/video system comprising the electronic device). Examples of the electronic device may include, but not limited to, a mobile phone (e.g. a multifunctional mobile phone), a personal digital assistant (PDA), and a personal computer such as a laptop computer.

As shown in FIG. 1, the apparatus 100-1 may comprise a phase detector 110 (labeled "PD" in FIG. 1, for brevity), an analog delay line 111A that is coupled to a reference clock source of a reference clock signal REF and is positioned at the beginning of an ordinary transmission path of an IC (which can be taken as an example of the aforementioned at least one IC) of the electronic device, another analog delay line 111B that is coupled to the phase detector 110 and is positioned at the end of an extraordinary transmission path of this IC, and a plurality of clock buffer pairs 112-1, 112-2, . . . , 112-(K−1), and 112-K (respectively labeled "CBP" in FIG. 1, for brevity), where the notation "K" may represent a positive integer that is greater than one, and the ordinary transmission path and the extraordinary transmission path may pass through the plurality of clock buffer pairs 112-1, 112-2, ..., 112-(K−1), and 112-K in different directions, respectively. For example, this IC can be a system on chip (SoC, which maybe referred to as SOC) chip having some memory interface terminals near the four sides of the SoC chip, and a random access memory (RAM) coupled to this IC can be implemented as a RAM chip having some memory interface terminals near the four sides of the RAM chip. In practice, some semiconductor chips of the electronic device, such as the SoC chip and the RAM chip in this embodiment, can be put together and packed into the same package, and the memory interface terminals of the RAM chip may be electrically connected to the memory interface terminals of the SoC chip through soldering. This is for illustrative purposes only, and is not meant to be a limitation of the present invention.

According to this embodiment, the phase detector 110, the analog delay line 111A, the analog delay line 111B, and the plurality of clock buffer pairs 112-1, 112-2, ..., 112-(K−1), and 112-K are positioned in this IC (e.g. the SoC chip). As shown in FIG. 1, the plurality of clock buffer pairs 112-1, 112-2, ..., 112-(K−1), and 112-K is electrically connected in series, and is positioned in a memory interface circuit of this IC, for coupling the reference clock signal REF to a physical circuit DDRPHY of the RAM (e.g. the RAM chip) through a memory interface terminal of this IC, such as the node between the physical circuit DDRPHY of the RAM and the clock buffer pair 112-K of this IC. In addition, the phase detector 110 of this embodiment is coupled to the plurality of clock buffer pairs 112-1, 112-2, ..., 112-(K−1), and 112-K through the analog delay line 111A and the analog delay line 111B, where one of the two input terminals of the phase detector 110 is electrically connected to the input terminal of the analog delay line 111A, and the other of the two input terminals of the phase detector 110 is electrically connected to the output terminal of the analog delay line 111B. Additionally, each clock buffer pair 112-$k$ of the plurality of clock buffer pairs 112-1, 112-2, ..., 112-(K−1), and 112-K (e.g. the index k can be a positive integer that falls within the range of the interval [1, N]) comprises two clock buffers that are arranged in different directions. More particularly, one of the two clock buffers is positioned on the ordinary transmission path for distributing the reference clock signal REF of this IC (e.g. the SoC chip) toward the RAM (e.g. the RAM chip), and the other of the two clock buffers is positioned on the extraordinary transmission path for being used as a route back path adjacent to the ordinary transmission path during calibration of the memory interface circuit, where the end of the ordinary transmission path is utilized as the beginning of the extraordinary transmission path. For example, the aforementioned memory interface terminal of this IC, such as the node between the physical circuit DDRPHY of the RAM and the clock buffer pair 112-K of this IC, can be regarded as the end of the ordinary transmission path, and can be regarded as the beginning of the extraordinary transmission path.

In this embodiment, the analog delay line 111A is arranged to delay the reference clock signal REF and output the delayed reference clock signal to the first clock buffer on the ordinary transmission path (e.g. the upper clock buffer of the clock buffer pair 112-1), and the analog delay line 111B is arranged to delay the reference clock signal obtained from the last clock buffer on the extraordinary transmission path (e.g. the lower clock buffer of the clock buffer pair 112-K). In addition, the phase detector 110 is arranged to perform phased detection on the reference clock signal REF obtained from the extraordinary transmission path (i.e. the output of the extraordinary transmission path), with respect to the reference clock signal REF directly obtained from the reference clock source mentioned above (i.e. the input of the ordinary transmission path), to calibrate the memory interface circuit according to distribution time of the reference clock signal REF. For example, suppose that the length of the analog delay line 111A (e.g. the number of enabled delay units therein) and the length of the analog delay line 111B (e.g. the number of enabled delay units therein) are initially equivalent to each other. The time required for distributing the reference clock signal REF through each analog delay line of the analog delay line 111A and the analog delay line 111B can be equal to TA, and the time required for distributing the reference clock signal REF through each row of the upper row of clock buffers and the lower row of clock buffers within the plurality of clock buffer pairs 112-1, 112-2, ..., 112-(K−1), and 112-K can be equal to TD. Thus, the total distribution time Tref for the reference clock signal REF to pass through the ordinary transmission path and the extraordinary transmission path during calibration of the memory interface circuit can be expressed as follows:

$$Tref=(TA+TD)*2;$$

where the apparatus 100-1 can determine the total distribution time Tref by using the phase detector 110 to perform the aforementioned phased detection. Please note that the distribution time Tord for the reference clock signal REF to pass through the ordinary transmission path can be expressed as follows:

$$Tord=(Tref/2)=(TA+TD).$$

As the apparatus 100-1 can determine the distribution time Tord as shown in the above equation, the apparatus 100-1 can adjust the length of the analog delay line 111A (e.g. the number of enabled delay units therein) according to the distribution time Tord.

In practice, the length of the analog delay line 111A (e.g. the number of enabled delay units therein) can be adjusted according to at least one phase detection result (e.g. one or more phase detection results) of the phase detector 110 during calibration of the memory interface circuit, and the aforementioned at least one phase detection result can be measured with respect to the reference clock signal REF directly obtained from the reference clock source.

Figure 2:
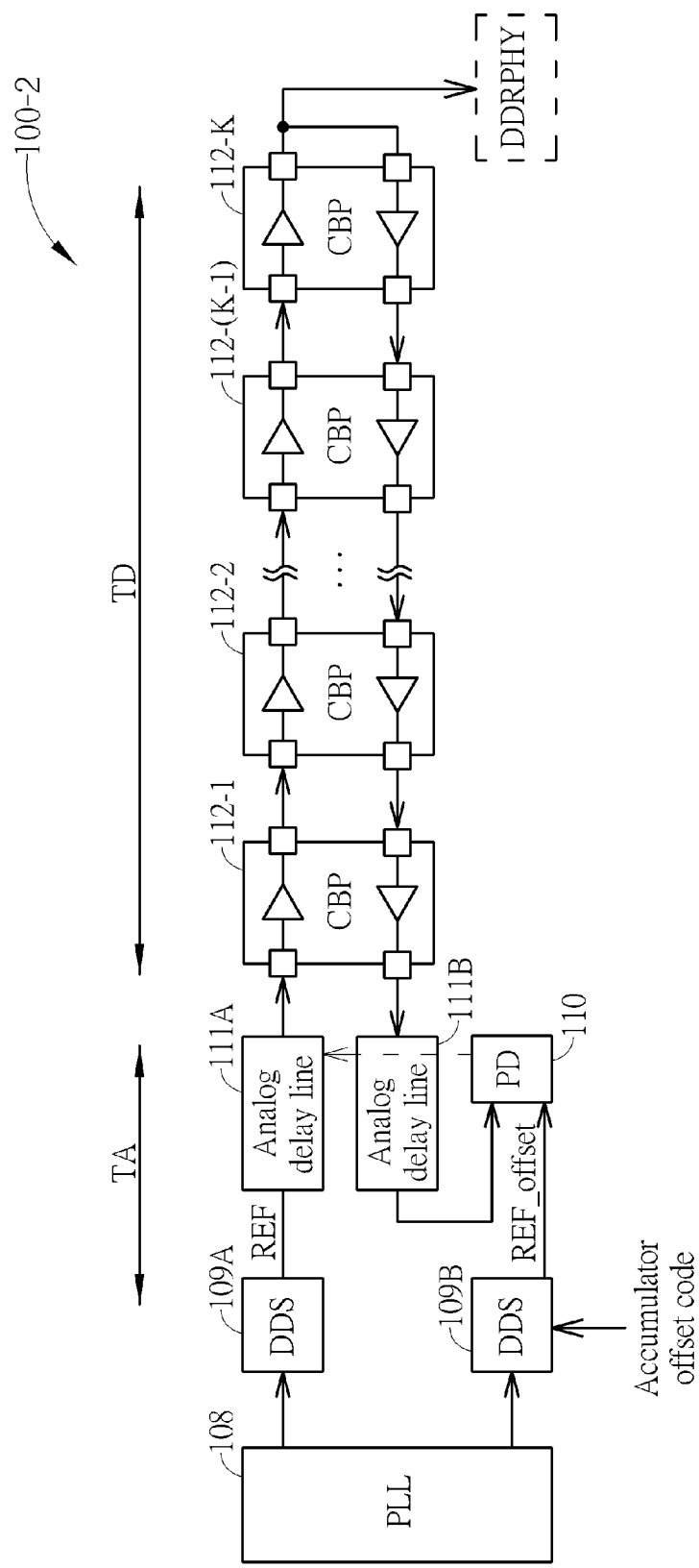
FIG. 2 is a diagram of an apparatus for performing memory interface control of an electronic device according to another embodiment of the present invention.

FIG. 2 is a diagram of an apparatus 100-2 for performing memory interface control of an electronic device according to another embodiment of the present invention, where the apparatus 100-2 comprises at least one portion (e.g. a portion or all) of an electronic device such as that mentioned above. For example, the apparatus 100-2 may comprise a portion of the electronic device mentioned above, and more particularly, can be at least one hardware circuit such as at least one IC within the electronic device. In another example, the apparatus 100-2 can be the whole of the electronic device mentioned above. In another example, the apparatus 100-2 may comprise a system comprising the electronic device mentioned above (e.g. an audio/video system comprising the electronic device).

As shown in FIG. 2, the phase detector 110 (labeled "PD" in FIG. 2, for brevity), the analog delay line 111A, the analog delay line 111B, and the plurality of clock buffer pairs 112-1, 112-2, ..., 112-(K−1), and 112-K (respectively labeled "CBP" in FIG. 2, for brevity) in this embodiment can be the same as that of the embodiment shown in FIG. 1, respectively. In addition to the phase detector 110, the analog delay line 111A, the analog delay line 111B, and the plurality of clock buffer pairs 112-1, 112-2, . . . , 112-(K−1), and 112-K mentioned above, the apparatus 100-2 may further comprise a phase locked loop (PLL) 108, a direct digital synthesis (DDS) module 109A that is coupled between the analog delay line 111A and the PLL 108, and another DDS module 109B that is coupled between the phase detector 110 and the PLL 108, where the reference clock signal REF of this embodiment is the output signal of the DDS module 109A.

According to this embodiment, the DDS module 109A and the DDS module 109B generate the reference clock signal REF and the altered reference clock signal REF offset according to the operations of the PLL 108. Please note that the DDS module 109B has an input terminal for inputting an accumulator offset code to adjust the altered reference clock signal REF offset. As the apparatus 100-2 can determine the total distribution time Tref mentioned above by using the phase detector 110 to perform the aforementioned phased detection, the apparatus 100-2 can determine the distribution time Tord mentioned above with aid of the architecture shown in FIG. 2, and therefore, the apparatus 100-2 can adjust the length of the analog delay line 111A (e.g. the number of enabled delay units therein) according to the distribution time Tord.

In practice, the length of the analog delay line 111A (e.g. the number of enabled delay units therein) can be adjusted according to at least one phase detection result (e.g. one or more phase detection results) of the phase detector 110 during calibration of the memory interface circuit, and the aforementioned at least one phase detection result of the phase detector 110 can be measured with respect to the altered reference clock signal that is associated to the accumulator offset code mentioned above. For brevity, similar descriptions for this embodiment are not repeated in detail here.

Figure 3:
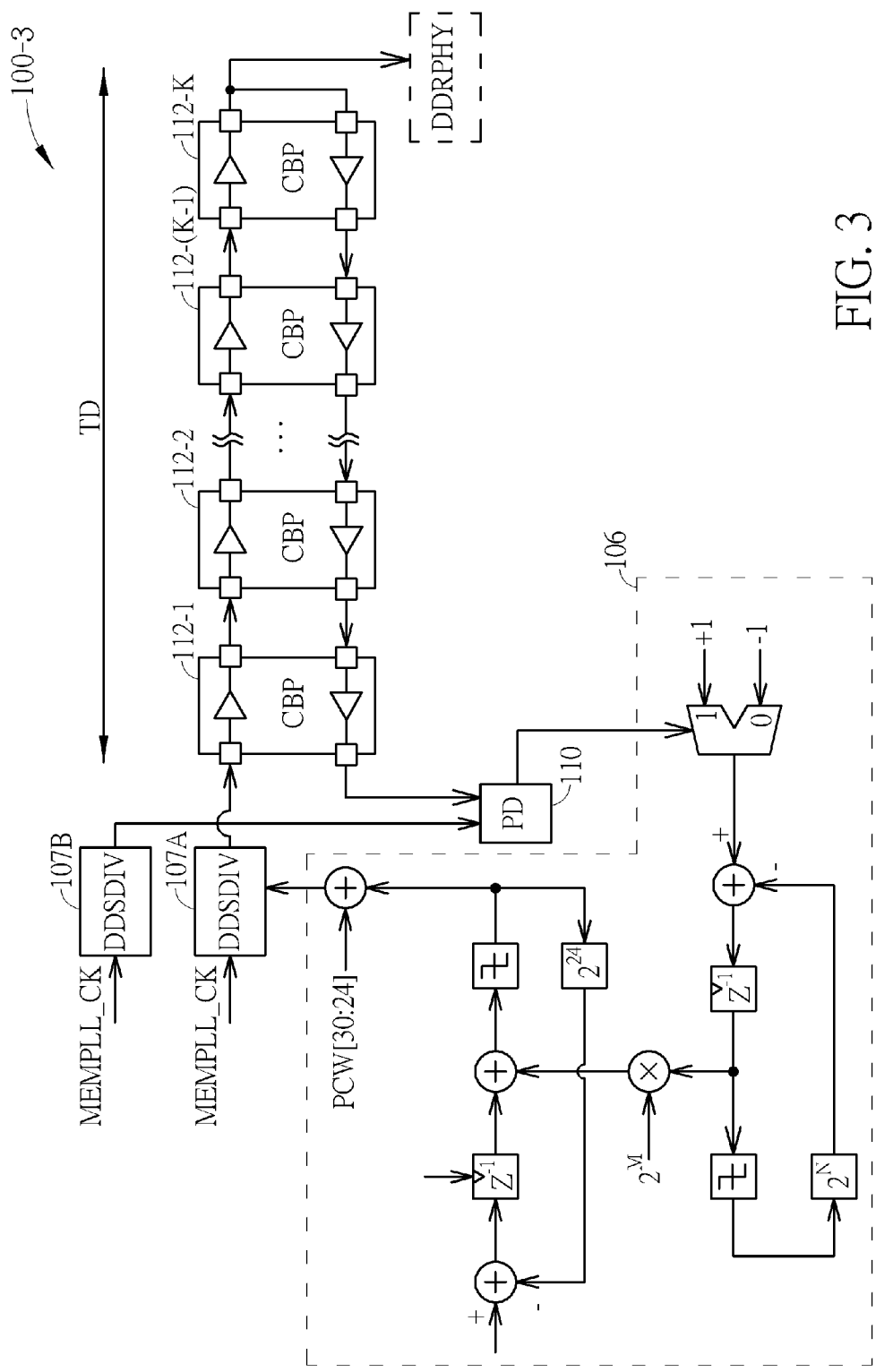
FIG. 3 is a diagram of an apparatus for performing memory interface control of an electronic device according to another embodiment of the present invention.

FIG. 3 is a diagram of an apparatus 100-3 for performing memory interface control of an electronic device according to another embodiment of the present invention, where the apparatus 100-3 comprises at least one portion (e.g. a portion or all) of an electronic device such as that mentioned above. For example, the apparatus 100-3 may comprise a portion of the electronic device mentioned above, and more particularly, can be at least one hardware circuit such as at least one IC within the electronic device. In another example, the apparatus 100-3 can be the whole of the electronic device mentioned above. In another example, the apparatus 100-3 may comprise a system comprising the electronic device mentioned above (e.g. an audio/video system comprising the electronic device).

As shown in FIG. 3, the phase detector 110 (labeled "PD" in FIG. 3, for brevity) and the plurality of clock buffer pairs 112-1, 112-2, . . . , 112-(K−1), and 112-K (respectively labeled "CBP" in FIG. 3, for brevity) in this embodiment can be the same as that of the embodiment shown in FIG. 1, respectively, and the reference clock signal REF mentioned above can be replaced by the reference clock signal MEMPLL_CK, which can be obtained from a PLL coupled to (or positioned within) the memory interface circuit mentioned above, such as the PLL 108 of the embodiment shown in FIG. 2. In addition to the phase detector 110 and the plurality of clock buffer pairs 112-1, 112-2, . . . , 112-(K−1), and 112-K mentioned above, the apparatus 100-3 may further comprise a DDS sub-module 107A (labeled "DDSDIV" in FIG. 3, for brevity) that is coupled between the reference clock source of the reference clock signal MEMPLL_CK and the beginning of the ordinary transmission path of this embodiment, another DDS sub-module 107B (labeled "DDSDIV" in FIG. 3, for brevity) that is coupled between the reference clock source of the reference clock signal MEMPLL_CK and the phase detector 110, and a calculation module 106 that is coupled between the DDS sub-module 107A and the phase detector 110, where one of the two input terminals of the phase detector 110 is electrically connected to the end of the extra ordinary transmission path of this embodiment. Please note that it is unnecessary to implement the analog delay line 111A mentioned above in the architecture shown in FIG. 3, and therefore, the upper clock buffer of the clock buffer pair 112-1 can be the beginning of the ordinary transmission path in this embodiment. In addition, it is unnecessary to implement the analog delay line 111B mentioned above in the architecture shown in FIG. 3, and therefore, the lower clock buffer of the clock buffer pair 112-1 can be the end of the extraordinary transmission path in this embodiment. In the architecture shown in FIG. 3, the calculation module 106 may comprise a plurality of calculation units labeled with some notations, respectively. For example, the calculation unit "+" having two inputs respectively labeled with "+" and "−" may perform a subtraction operation, while the calculation unit "+" whose inputs are not respectively labeled with "+" and "−" may perform a summation operation. In another example, the calculation unit "X" may perform a multiplication operation, the calculation unit "$2^{24}$" may perform an operation of multiplying the input thereof by $2^{24}$, and the calculation unit "$2^N$" may perform an operation of multiplying the input thereof by $2^N$, where the notation "N" may represent a positive integer that is greater than one. In another example, the calculation unit "$Z^{-1}$" may calculate a reciprocal of the input thereof. Additionally, the notation "$2^M$" may represent a predetermined value $2^M$, where the notation "M" may represent a positive integer that is greater than one. Please note that the notation "PCW[30:24]" may represent some bits [30:24] carried by a specific signal PCW, while the notation "PCW[23:0]" may represent some other bits [23:0] carried by the specific signal PCW. As these calculation units are well known in the related art, implementation details of these calculation units (and the operations thereof) are not described in detail here.

According to this embodiment, the DDS sub-module 107A is arranged to perform a DDS operation on the reference clock signal MEMPLL_CK to generate a DDS result and output the DDS result to the first clock buffer on the ordinary transmission path (i.e. the upper clock buffer of the clock buffer pair 112-1). In addition, the DDS sub-module 107B is arranged to perform another DDS operation on the reference clock signal MEMPLL_CK to generate another DDS result and output the other DDS result to the phase detector 110. Additionally, the calculation module 106 is arranged to perform calculations according to at least one phase detection result (e.g. one or more phase detection results) of the phase detector 110 to generate at least one calculation result, for altering the DDS operation performed by the DDS sub-module 107A, where the DDS operation of the DDS sub-module 107A corresponds to the aforementioned at least one phase detection result of the phase detector 110 during calibration of the memory interface circuit. More particularly, the aforementioned at least one phase detection result can be input into the first stage in the calculation module 106, such as the multiplexer illustrated around the lower right corner of the calculation module 106 shown in FIG. 3, and can be used as a selection signal to control the multiplexer, and the multiplexer can selectively input an increment (e.g. the increment of +1) or a decrement (e.g. the decrement of −1) into the next stage according to the selection signal.

In this embodiment, the aforementioned time TA required for distributing the reference clock signal REF through each analog delay line of the analog delay line 111A and the analog delay line 111B mentioned above can be equal to zero. Thus, the total distribution time Tref for the reference clock signal REF to pass through the ordinary transmission path and the extraordinary transmission path during calibration of the memory interface circuit can be expressed as follows:

$$Tref=(TA+TD)*2=(TA+0)*2=(2*TA);$$

where the apparatus 100-3 can determine the total distribution time Tref by using the phase detector 110 to perform the aforementioned phased detection. Please note that the distribution time Tord for the reference clock signal MEMPLL_CK (or the derivative thereof) to pass through the ordinary transmission path can be expressed as follows:

$$Tord=(Tref/2)=(TA+TD)=(TA+0)=TA.$$

As the apparatus 100-3 can determine the total distribution time Tref of this embodiment by using the phase detector 110 to perform the aforementioned phased detection, the apparatus 100-3 can determine the distribution time Tord mentioned above with aid of the architecture shown in FIG. 3, and therefore, the apparatus 100-3 can adjust (or alter) the DDS operation performed by the DDS sub-module 107A according to the distribution time Tord.

According some embodiments of the present invention, such as any of the embodiments described above or some variations thereof, a method for performing memory interface control of an electronic device such as that mentioned above is provided, where the method may comprise the steps of: utilizing a plurality of clock buffer pairs such as that mentioned above (e.g. the plurality of clock buffer pairs 112-1, 112-2, . . . , 112-(K−1), and 112-K in one embodiment of the embodiments respectively shown in FIG. 1, FIG. 2, and FIG. 3) to transmit a reference clock signal of an IC of the electronic device (e.g. the reference clock signal of the IC in the aforementioned one embodiment of the embodiments respectively shown in FIG. 1, FIG. 2, and FIG. 3), the plurality of clock buffer pairs being electrically connected in series and positioned in a memory interface circuit of the IC, such as the memory interface circuit mentioned above, where each clock buffer pair of the plurality of clock buffer pairs comprises two clock buffers that are arranged in different directions, one of the two clock buffers is positioned on the aforementioned ordinary transmission path for distributing the reference clock signal of the IC toward the aforementioned RAM of the electronic device, the other of the two clock buffers is positioned on the aforementioned extraordinary transmission path for being used as a route back path adjacent to the ordinary transmission path during calibration of the memory interface circuit, and the end of the ordinary transmission path is utilized as the beginning of the extraordinary transmission path; and utilizing a phase detector in the IC, such as the phase detector 110 mentioned above, to perform phased detection on the reference clock signal obtained from the extraordinary transmission path, to calibrate the memory interface circuit according to distribution time of the reference clock signal. As a result of adjusting the timing of the reference clock signal with aid of the plurality of clock buffer pairs 112-1, 112-2, . . . , 112-(K−1), and 112-K, clock deskew of the reference clock signal can be performed.

Based on any of the architectures respectively shown in FIG. 1, FIG. 2, and FIG. 3, as the timing of the reference clock signal can be accurately adjusted with aid of the plurality of clock buffer pairs 112-1, 112-2, . . . , 112-(K−1), and 112-K, the memory interface circuit of the IC mentioned above can be properly calibrated.

According some embodiments of the present invention, it is unnecessary to implement the plurality of clock buffer pairs 112-1, 112-2, . . . , 112-(K−1), and 112-K mentioned above. For example, the aforementioned IC equipped with the phase detector 110 (e.g. the SoC chip) may send a reference clock signal such as that mentioned above (e.g. the reference clock signal REF, or the reference clock signal MEMPLL_CK) to the RAM (e.g. the RAM chip), and may receive a local clock signal from the RAM. In addition, this IC may perform phase detection and adjust the phase of the reference clock signal sent to the RAM, in order to lock this reference clock signal onto the local clock signal obtained from the RAM, where a phase interpolator (which can also be referred to as PI) may be used during this operation. In a situation where the skew issues are beyond the capability of the phase interpolator, the novel architecture disclosed in any of the following embodiments (and the associated method) can correctly perform timing alignment for paths having different lengths, and can guarantee the overall performance of the electronic device.

Figure 4:
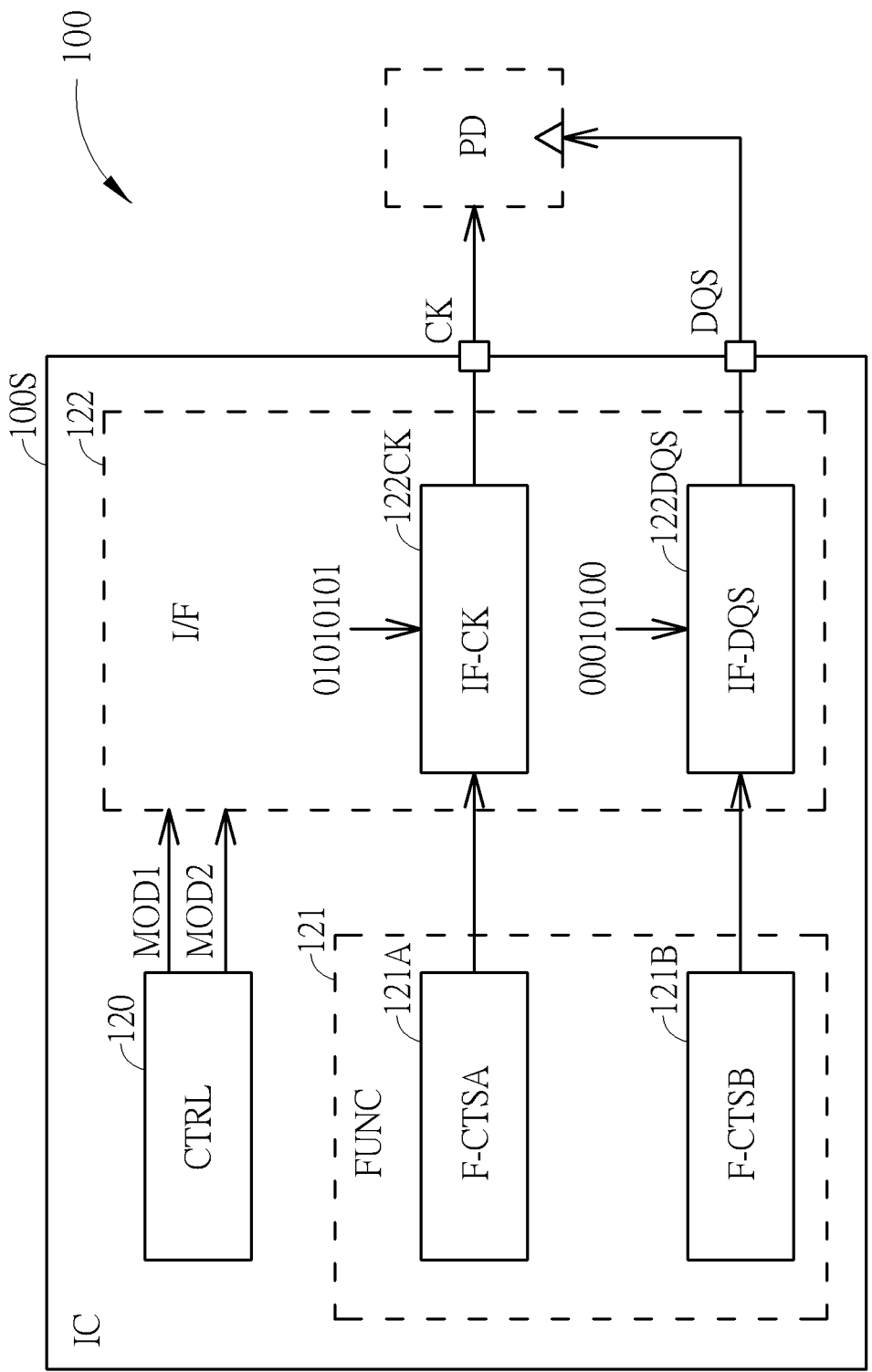
FIG. 4 is a diagram of an apparatus for performing memory interface control of an electronic device according to an embodiment of the present invention.

FIG. 4 is a diagram of an apparatus 100 for performing memory interface control of an electronic device according to an embodiment of the present invention, where the apparatus 100 comprises at least one portion (e.g. a portion or all) of an electronic device such as that mentioned above. For example, the apparatus 100 may comprise a portion of the electronic device mentioned above, and more particularly, can be at least one hardware circuit such as at least one IC within the electronic device. In another example, the apparatus 100 can be the whole of the electronic device mentioned above. In another example, the apparatus 100 may comprise a system comprising the electronic device mentioned above (e.g. an audio/video system comprising the electronic device).

As shown in FIG. 4, the apparatus 100 may comprise a controller 120, a function circuit 121, and a memory interface circuit 122 (respectively labeled "CTRL", "FUNC", and "I/F" in FIG. 4, for brevity), where the function circuit 121 may comprise a plurality of function modules for performing various types of functions, such as a function module 121A (labeled "F-CTSA" in FIG. 4, for better comprehension) for performing a function CTSA and a function module 121B (labeled "F-CTSB" in FIG. 4, for better comprehension) for performing a function CTSB, and the memory interface circuit 122 may comprise a plurality of memory interface modules for signal control of some memory interface signals, such as a memory interface module 122CK (labeled "IF-CK" in FIG. 4, for better comprehension) for signal control of a clock signal CK and a memory interface module 122DQS (labeled "IF-DQS" in FIG. 4, for better comprehension) for signal control of a data signal DQS. In this embodiment, the controller 120, the function circuit 121, and the memory interface circuit 122 are positioned in an IC 100S of the electronic device, such as the aforementioned IC equipped with the phase detector 110 (e.g. the SoC chip). In addition, the controller 120 and the function circuit 121 are coupled to the memory interface circuit 122.

According to this embodiment, the memory interface circuit 122 is arranged for controlling the RAM mentioned above (e.g. the RAM chip). As shown in FIG. 4, the signals of the memory interface circuit 122 (i.e. the memory interface signals mentioned above) may comprise the clock signal CK and the data signal DQS. For example, a signal measurement unit such as a phase detector (labeled "PD" in FIG. 4, for brevity) can be installed in the RAM to monitor the timing relationship between the clock signal CK and the data signal DQS, and to send back a measurement result indicating the timing relationship between the clock signal CK and the data signal DQS toward the IC 100S, and more particularly, toward the controller 120. This is for illustrative purposes only, and is not meant to be a limitation of the present invention. In another example, the signal measurement unit such as this phase detector (labeled "PD" in FIG. 4, for brevity) can be installed in the IC 100S and positioned near the terminals for coupling the clock signal CK and the data signal DQS to the RAM.

In practice, the controller 120 can control the memory interface module 122CK through a modulation signal MOD1 that carries a first set of bits, and control the memory interface module 122DQS through a modulation signal MOD2 that carries a second set of bits. For example, the first set of bits may comprise a series of bit stream such as the bit stream "01010101" input into the memory interface module 122CK shown in FIG. 4, and the second set of bits may comprise a series of bit stream such as the bit stream "00010100" input into the memory interface module 122DQS shown in FIG. 4.

Based upon the architecture shown in FIG. 4, the controller 120 may calibrate the memory interface circuit 122 according to the aforementioned measurement result indicating the timing relationship between the clock signal CK and the data signal DQS, by using the modulation signal MOD1 that carries the first set of bits and the modulation signal MOD2 that carries the second set of bits. For example, during calibrating the memory interface circuit 122 in a calibration mode of the memory interface circuit 122, the controller 120 may properly determine a specific data pattern to be carried by the modulation signal MOD2, such as the data pattern that cause the best measurement result within a plurality of measurement results obtained from the signal measurement unit such as this phase detector, and store this data pattern for further use of data transmission in a normal mode of the memory interface circuit 122. Thus, the controller 120 may apply this data pattern to the memory interface circuit 122 in the normal mode of the memory interface circuit 122. As a result, the overall performance of the electronic device can be guaranteed. This is for illustrative purposes only, and is not meant to be a limitation of the present invention.

According to some variations of this embodiment, the controller 120 may adjust the difference between the lengths of two paths according to one or more measurement results obtained from the signal measurement unit such as this phase detector (e.g. the plurality of measurement results mentioned above). For example, in a situation where the memory interface circuit 122 comprises a path-length adjustment module on the path of the data signal DQS, such as a copy of the analog delay line 111A, the controller 120 may adjust the difference between the length of the path of the data signal DQS and the length of the path of the clock signal CK. In another example, in a situation where the memory interface circuit 122 comprises a path-length adjustment module on the path of the clock signal CK, such as a copy of the analog delay line 111A, the controller 120 may adjust the difference between the length of the path of the clock signal CK and the length of the path of the data signal DQS.

Figure 5:
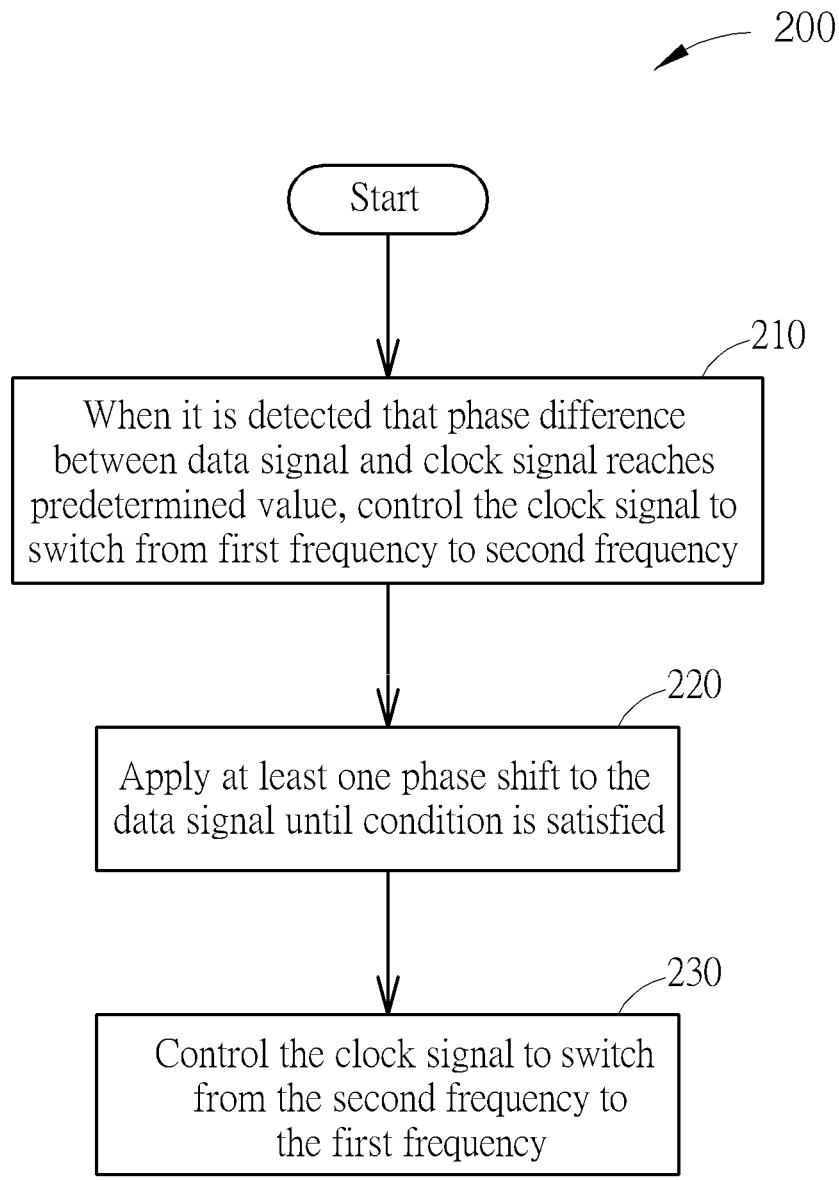
FIG. 5 illustrates a flowchart of a method for performing memory interface control of an electronic device according to an embodiment of the present invention.

FIG. 5 illustrates a flowchart of a method 200 for performing memory interface control of an electronic device according to an embodiment of the present invention. The method 200 shown in FIG. 5 can be applied to the apparatus 100 shown in FIG. 4, and can be applied to the controller 120 and the memory interface circuit 122 that operates under control of the controller 120. The method can be described as follows.

In Step 210, when it is detected that a phase difference between the data signal DQS and the clock signal CK reaches a predetermined value, the controller 120 controls the clock signal CK to switch from a first frequency to a second frequency (e.g. by adjusting the bit stream input into the memory interface module 122CK). For example, the first frequency can be a multiple of the second frequency, and the ratio of the first frequency to the second frequency can be equivalent to a positive integer that is greater than one. More particularly, when it is detected that the phase difference between the clock signal CK and the data signal DQS reaches the predetermined value, the controller 120 enlarges a partial waveform of the data signal DQS with an enlarging factor along the time axis (e.g. by adjusting the bit stream input into the memory interface module 122DQS). Typically, the enlarging factor can be equivalent to the ratio of the first frequency to the second frequency.

In Step 220, the controller 120 applies at least one phase shift to the data signal DQS (e.g. by adjusting the bit stream input into the memory interface module 122CK) until a condition is satisfied, where the aforementioned at least one phase shift is applied to the data signal after the clock signal CK switches from the first frequency to the second frequency. More particularly, the aforementioned at least one phase shift is applied to the data signal DQS after the partial waveform of the data signal DQS is enlarged with the enlarging factor mentioned above along the time axis.

In Step 230, the controller 120 controls the clock signal CK to switch from the second frequency to the first frequency (e.g. by adjusting the bit stream input into the memory interface module 122CK), where the clock signal CK switches from the second frequency to the first frequency after the aforementioned at least one phase shift is applied to the data signal DQS. More particularly, the controller 120 shrinks an associated partial waveform of the data signal DQS with a shrinking factor along the time axis (e.g. by adjusting the bit stream input into the memory interface module 122DQS), where the associated partial waveform of the data signal DQS is shrunken with the shrinking factor mentioned above along the time axis after the aforementioned at least one phase shift is applied to the data signal DQS. Typically, the associated partial waveform corresponds to the partial waveform mentioned above, and the shrinking factor is a reciprocal of the enlarging factor. For example, the partial waveform mentioned above may comprise at least two pulses corresponding to a data pattern carried by the data signal DQS, the associated partial waveform may comprise at least two pulses corresponding to an associated data pattern carried by the data signal DQS, and the associated data pattern may correspond to the data pattern.

In practice, the controller 120 may control whether to pull up or pull down the clock signal CK according to the modulation signal MOD1 that carries the first set of bits mentioned above, and may control whether to pull up or pull down the data signal DQS according to the modulation signal MOD2 that carries the second set of bits mentioned above. By using the modulation signal MOD1 that carries the first set of bits and the modulation signal MOD2 that carries the second set of bits, the controller 120 may calibrate the memory interface circuit 122 with aid of the aforementioned at least one phase shift. For example, in Step 210, the controller 120 may control the clock signal CK to switch from the first frequency to the second frequency by applying repeated bits to the modulation signal MOD1. More particularly, when it is detected that the phase difference between the clock signal CK and the data signal DQS reaches the predetermined value, the controller 120 may enlarge the partial waveform of the data signal DQS with the enlarging factor along the time axis by applying repeated bits to the modulation signal MOD2, where the aforementioned at least one phase shift is applied to the data signal DQS after the partial waveform of the data signal DQS is enlarged with the enlarging factor along the time axis. In addition, in Step 220, the controller 120 may apply the aforementioned at least one phase shift to the data signal DQS by performing bit shifting on the modulation signal MOD2.

According to this embodiment, the controller 120 may calibrate the memory interface circuit 122 by utilizing a bit shifting amount corresponding to the aforementioned at least one phase shift as a parameter to be calibrated, where the bit shifting amount is applied to the data carried by the data signal DQS after the calibration of the memory interface circuit 122. For example, the bit shifting amount can be applied to the data carried by the data signal DQS in the aforementioned normal mode of the memory interface circuit 122. This is for illustrative purposes only, and is not meant to be a limitation of the present invention.

According to some variations of this embodiment, the controller 120 may calibrate the memory interface circuit 122 by adjusting the length of a delay line of the memory interface circuit 122 according to the aforementioned at least one phase shift, where the length of the delay line corresponds to the number of delay units in this delay line that are kept enabled. For example, in a situation where the memory interface circuit 122 comprises a path-length adjustment module on the path of the data signal DQS, such as a copy of the analog delay line 111A, the controller 120 may adjust the number of enabled delay units in the copy of the analog delay line 111A.

Please note that, in the embodiment shown in FIG. 5, the phase difference mentioned in Step 210 can be measured as an absolute value, no matter whether the clock signal CK leads or lags behind the data signal DQS. For example, the phase difference mentioned above can be equivalent to the absolute value of the difference obtained from subtracting the time of a rising edge of a pulse of the clock signal CK from the time of a rising edge of a pulse of the data signal DQS. In another example, the phase difference mentioned above can be equivalent to the absolute value of the difference obtained from subtracting the time of a rising edge of a pulse of the data signal DQS from the time of a rising edge of a pulse of the clock signal CK. This is for illustrative purposes only, and is not meant to be a limitation of the present invention. According to some variations of this embodiment, as long as the controller 120 can correctly determine whether to trigger some calibration operations of the memory interface circuit 122 (e.g. some operations of the method 200 shown in FIG. 5), it is unnecessary that the phase difference is measured as an absolute value. For example, when it is sure that the difference obtained from subtracting the time of a rising edge of a pulse of the clock signal CK from the time of a rising edge of a pulse of the data signal DQS is greater than or equal to zero, the controller 120 can use this difference as the phase difference mentioned above. In another example, when it is sure that the difference obtained from subtracting the time of a rising edge of a pulse of the data signal DQS from the time of a rising edge of a pulse of the clock signal CK is greater than or equal to zero, the controller 120 can use this difference as the phase difference mentioned above.

According to some embodiments of the present invention, the aforementioned at least one phase shift can be equivalent to a half of a period of the clock signal CK having the first frequency, or can be equivalent to a multiple of the half of the period of the clock signal CK having the first frequency. This is for illustrative purposes only, and is not meant to be a limitation of the present invention. According to some embodiments of the present invention, the minimum phase shift that can be applied by the controller 120 in Step 220 may vary. For example, the aforementioned at least one phase shift can be equivalent to (1/Ns) of the period of the clock signal CK having the first frequency, where the notation "Ns" may represent a positive integer that is greater than one, and is typically a finite number. In another example, the aforementioned at least one phase shift can be equivalent to a multiple of the aforementioned (1/Ns) of the period of the clock signal CK having the first frequency.

Figure 6:
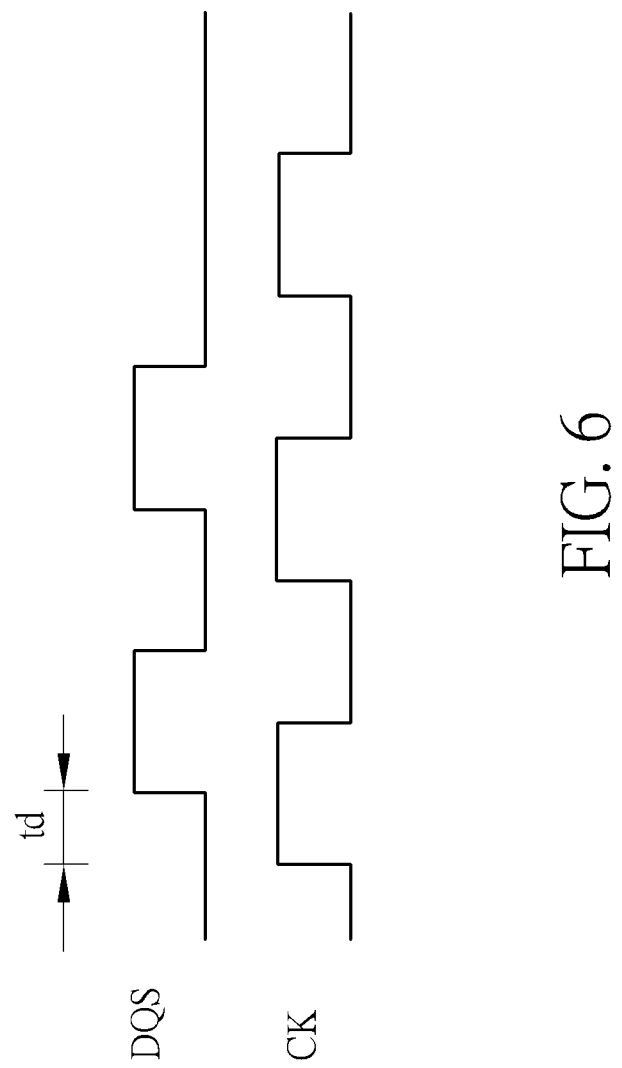
FIG. 6 illustrates a control scheme involved with the method shown in FIG. 5 according to an embodiment of the present invention.

FIG. 6 illustrates a control scheme involved with the method 200 shown in FIG. 5 according to an embodiment of the present invention. According to this embodiment, the controller 120 may determine whether to trigger some calibration operations of the memory interface circuit 122, such as some operations of the method 200 shown in FIG. 5, according to whether the phase difference between the clock signal CK and the data signal DQS reaches the predetermined value, where the phase difference can be measured as an absolute value in this embodiment, no matter whether the clock signal CK leads or lags behind the data signal DQS. For example, the phase difference may represent a skew amount, and the predetermined value may represent 0.5 clock cycle (or 0.5 tick) of a reference clock signal in the IC 100S, such as a half of the period of the clock signal CK. In a situation where the phase difference does not reach the predetermined value, the controller 120 may use a phase interpolator such as that mentioned above to perform fine tuning operations on one of the clock signal CK and the data signal DQS (more particularly, the data signal DQS in the following embodiments), where it is unnecessary to trigger the calibration operations mentioned above, such as some operations of the method 200 shown in FIG. 5. Please note that the time interval td shown in FIG. 6 corresponds to the phase difference mentioned above, and can be used for determining the phase difference.

Figure 7:
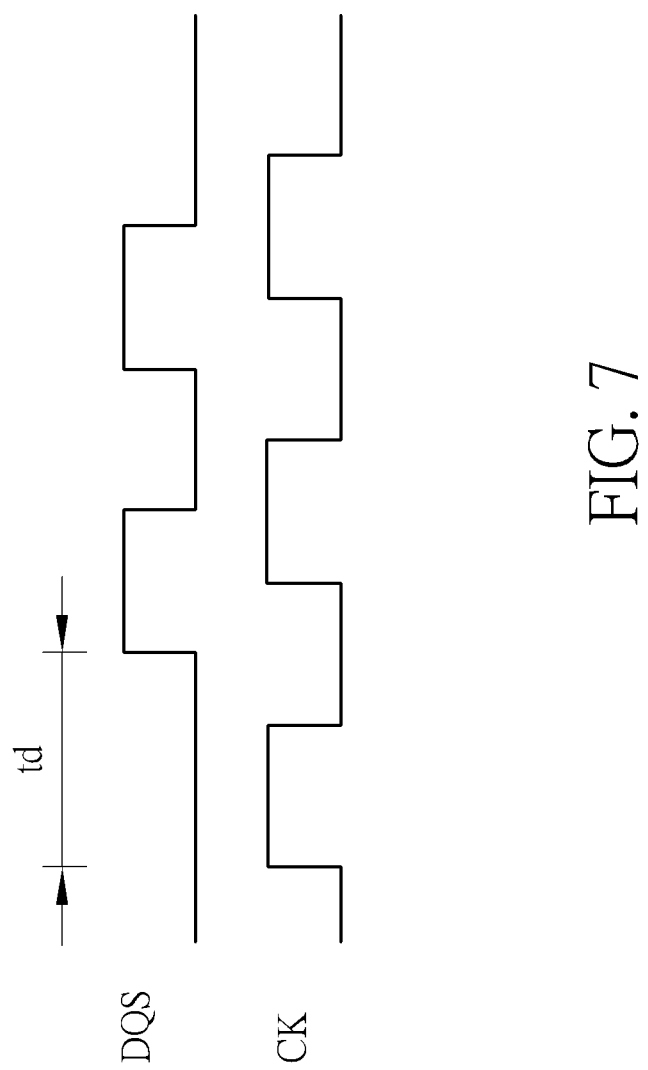
FIG. 7 illustrates a control scheme involved with the method shown in FIG. 5 according to another embodiment of the present invention.

FIG. 7 illustrates a control scheme involved with the method 200 shown in FIG. 5 according to another embodiment of the present invention. According to this embodiment, the controller 120 may determine whether to trigger some calibration operations of the memory interface circuit 122, such as some operations of the method 200 shown in FIG. 5, according to whether the phase difference between the clock signal CK and the data signal DQS reaches the predetermined value, where the phase difference can be measured as an absolute value in this embodiment, no matter whether the clock signal CK leads or lags behind the data signal DQS. For example, the phase difference may represent a skew amount such as that mentioned above, and the predetermined value may represent 0.5 clock cycle (or 0.5 tick) of a reference clock signal in the IC 100S, such as a half of the period of the clock signal CK. In a situation where the phase difference reaches the predetermined value (e.g. the phase difference is greater than or equal to the predetermined value), the controller 120 may trigger the calibration operations mentioned above, such as some operations of the method 200 shown in FIG. 5. Please note that the time interval td shown in FIG. 7 corresponds to the phase difference mentioned above, and can be used for determining the phase difference. For brevity, similar descriptions for this embodiment are not repeated in detail here.

Figure 8:
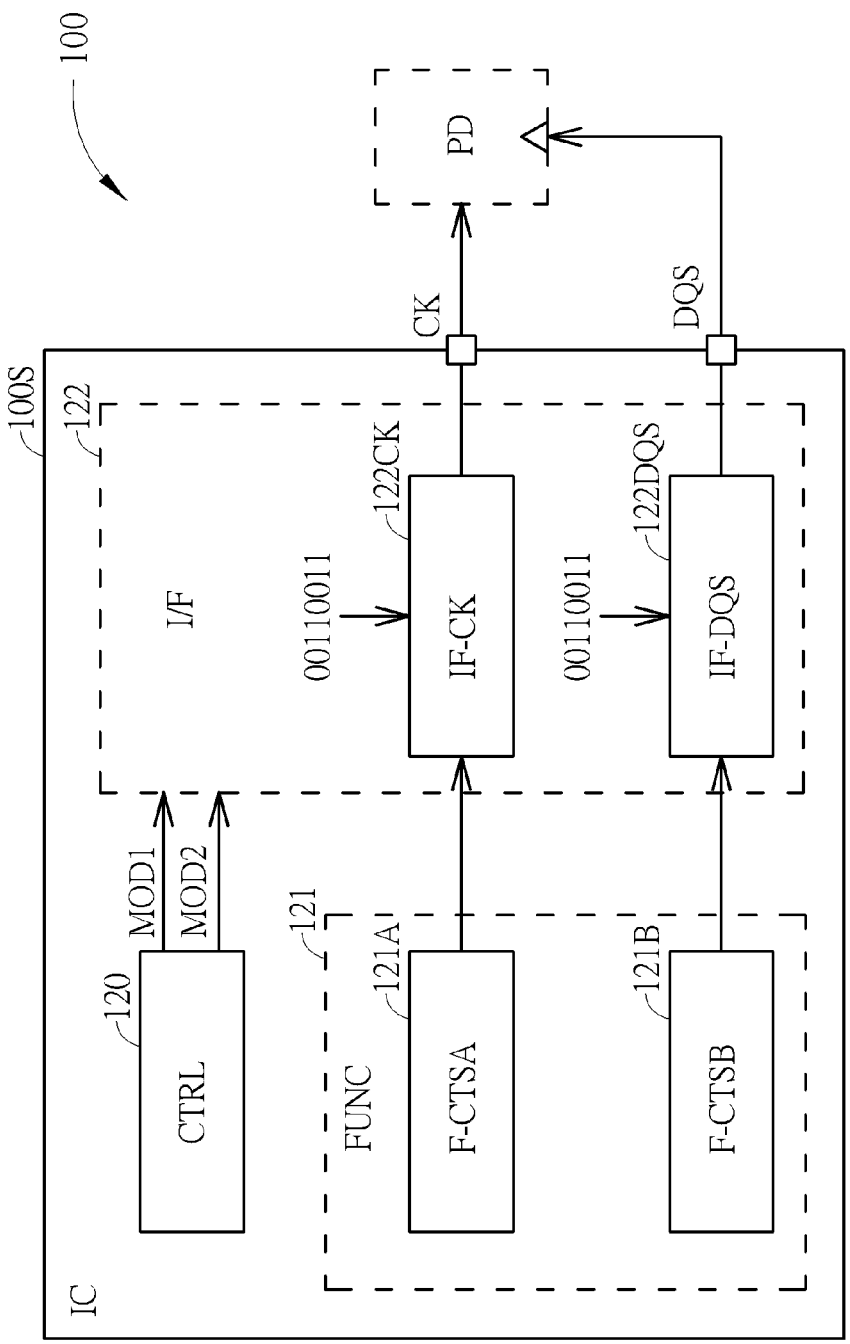
FIG. 8 illustrates two series of bit streams used in a speed down phase of the control scheme shown in FIG. 7 according to an embodiment of the present invention.

FIG. 8 illustrates two series of bit streams used in a speed down phase of the control scheme shown in FIG. 7 according to an embodiment of the present invention. For example, the first set of bits may comprise a series of bit stream such as the bit stream "00110011" input into the memory interface module 122CK shown in FIG. 8, and the second set of bits may comprise a series of bit stream such as the bit stream "00110011" input into the memory interface module 122DQS shown in FIG. 8.

In comparison with the architecture shown in FIG. 4, the bit stream input into the memory interface module 122CK in this embodiment comprises a data pattern having repeated bits of the original data pattern in the modulation signal MOD1 of the embodiment shown in FIG. 4. As a result, the speed that the memory interface module 122CK controls the variations of the logical states of the clock signal CK (e.g. the speed of switching the logical states of the clock signal CK) becomes lower than that in the embodiment shown in FIG. 4, and more particularly, is a half of that in the embodiment shown in FIG. 4. In addition, in comparison with the architecture shown in FIG. 4, the bit stream input into the memory interface module 122DQS in this embodiment comprises a data pattern having repeated bits of the original data pattern in the modulation signal MOD2 of the embodiment shown in FIG. 4. As a result, the speed that the memory interface module 122DQS controls the variations of the logical states of the data signal DQS (e.g. the speed of switching the logical states of the data signal DQS) becomes lower than that in the embodiment shown in FIG. 4, and more particularly, is a half of that in the embodiment shown in FIG. 4.

Figure 9:
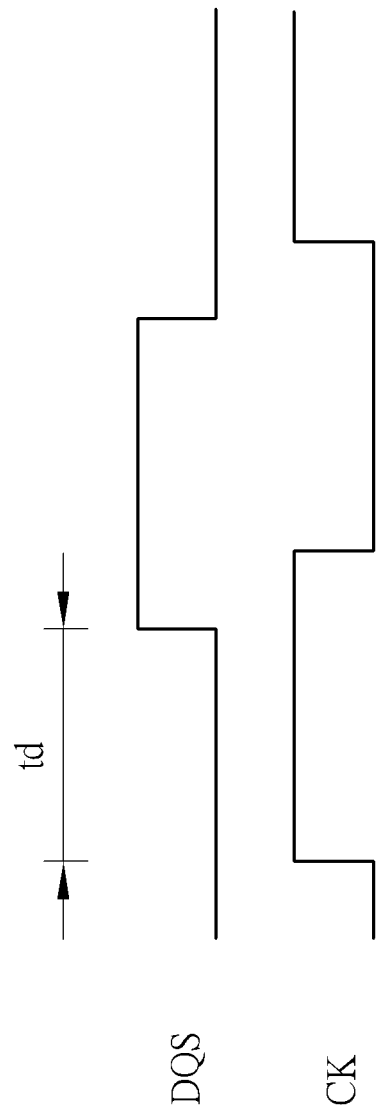
FIG. 9 illustrates the associated waveforms corresponding to the two series of bit streams shown in FIG. 8 according to an embodiment of the present invention.

FIG. 9 illustrates the associated waveforms corresponding to the two series of bit streams shown in FIG. 8 according to an embodiment of the present invention. In comparison with the waveforms shown in FIG. 7, the speed that the clock signal CK switches between the logical states thereof becomes lower than that in the embodiment shown in FIG. 7, and more particularly, is a half of that in the embodiment shown in FIG. 7. For example, by adjusting the bit stream input into the memory interface module 122CK, the controller 120 controls the clock signal CK to switch from the first frequency to the second frequency, where the first frequency is twice the second frequency in this embodiment. In addition, in comparison with the waveforms shown in FIG. 7, the speed that the data signal DQS switches between the logical states thereof becomes lower than that in the embodiment shown in FIG. 7, and more particularly, is a half of that in the embodiment shown in FIG. 7. For example, by adjusting the bit stream input into the memory interface module 122DQS, the controller 120 enlarges the partial waveform of any of the two pulses of the data signal DQS shown in FIG. 7 with the enlarging factor along the time axis in this embodiment, where the enlarging factor is equivalent to the ratio of the first frequency to the second frequency, and more particularly, is equal to two in this embodiment. Please note that, by adjusting the bit stream input into the memory interface module 122CK, the controller 120 also enlarges the partial waveform of any of the pulses of the clock signal CK shown in FIG. 7 with the enlarging factor mentioned above along the time axis in this embodiment.

Figure 10:
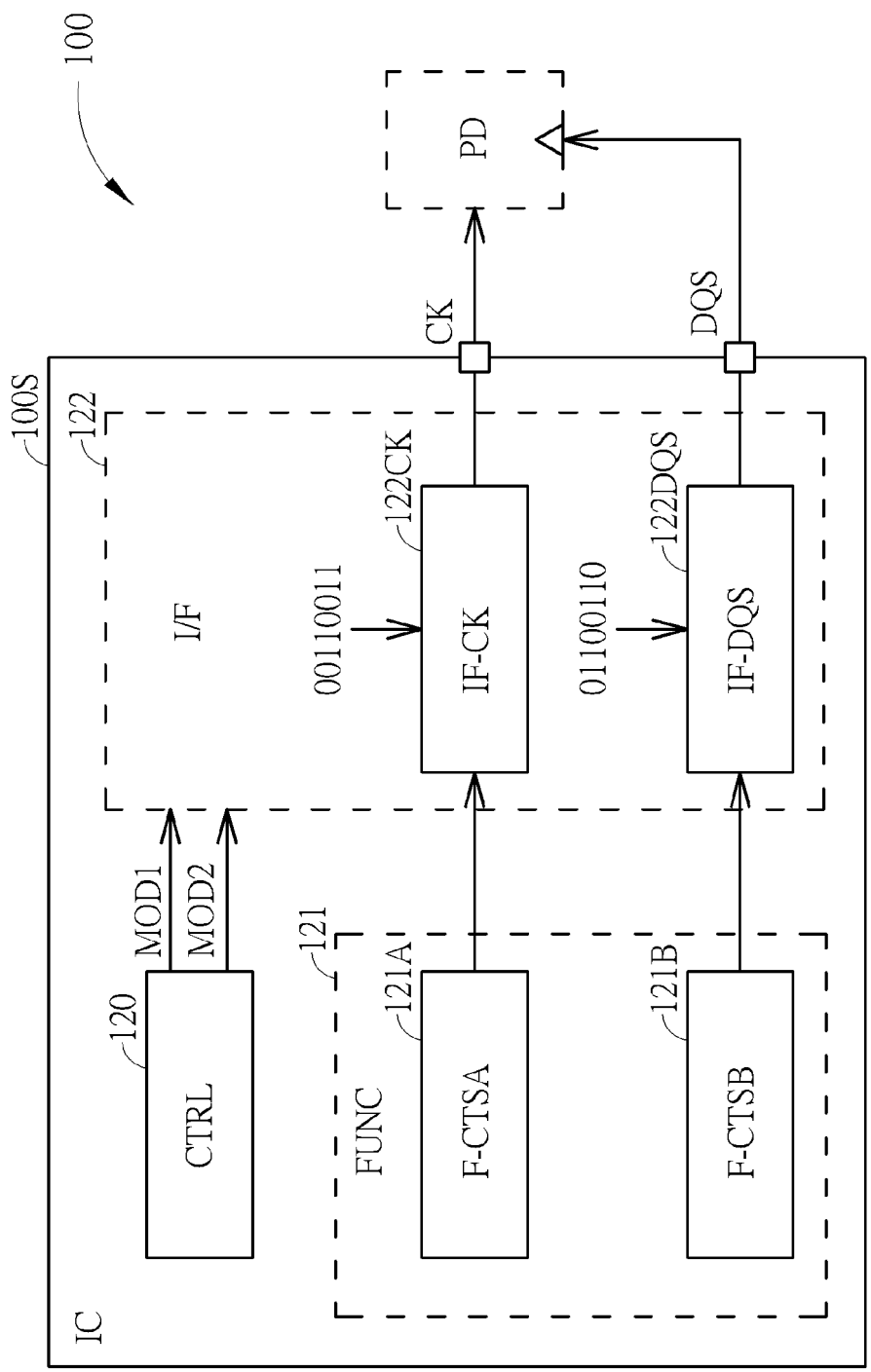
FIG. 10 illustrates two series of bit streams used in a bit shifting phase of the control scheme shown in FIG. 7 according to an embodiment of the present invention.

FIG. 10 illustrates two series of bit streams used in a bit shifting phase of the control scheme shown in FIG. 7 according to an embodiment of the present invention. For example, the first set of bits may comprise a series of bit stream such as the bit stream "00110011" input into the memory interface module 122CK shown in FIG. 10, and the second set of bits may comprise a series of bit stream such as the bit stream "01100110" input into the memory interface module 122DQS shown in FIG. 10.

According to this embodiment, the minimum phase shift that the controller 120 may apply to the data signal DQS can be a unit interval (UI), such as a half of the period of the clock signal CK having the first frequency (e.g. the clock signal CK controlled with the bit stream "01010101" in the embodiment shown in FIG. 4, or the clock signal CK in the embodiment shown in FIG. 7). For example, the aforementioned at least one phase shift in Step 220 can be equivalent to the half of the period of the clock signal CK having the first frequency. This is for illustrative purposes only, and is not meant to be a limitation of the present invention. In another example, the aforementioned at least one phase shift in Step 220 can be equivalent to a multiple of the half of the period of the clock signal CK having the first frequency. In another example, the aforementioned at least one phase shift in Step 220 may comprise a plurality of phase shifts, where each phase shift of the plurality of phase shifts can be equivalent to the half of the period of the clock signal CK having the first frequency. In some other examples, the aforementioned at least one phase shift in Step 220 may comprise a plurality of phase shifts, where one or more phase shifts of the plurality of phase shifts can be equivalent to the half of the period of the clock signal CK having the first frequency, and one or more other phase shifts of the plurality of phase shifts can be equivalent to a multiple of the half of the period of the clock signal CK having the first frequency.

In comparison with the architecture shown in FIG. 8, the bit stream input into the memory interface module 122CK in this embodiment can be kept the same. As a result, the speed that the memory interface module 122CK controls the variations of the logical states of the clock signal CK (e.g. the speed of switching the logical states of the clock signal CK) can be kept the same as that in the embodiment shown in FIG. 8. In addition, in comparison with the architecture shown in FIG. 8, the bit stream input into the memory interface module 122DQS in this embodiment comprises a data pattern having shifted bits of the original data pattern in the modulation signal MOD2 of the embodiment shown in FIG. 8, where the bit shifting amount is equal to one bit in this embodiment. As a result, the speed that the memory interface module 122DQS controls the variations of the logical states of the data signal DQS (e.g. the speed of switching the logical states of the data signal DQS) can be kept the same as that in the embodiment shown in FIG. 8, where the time when any of the two pulses of the data signal DQS appears can be changed, and more particularly, can be earlier than that in the embodiment shown in FIG. 8. Please note that the aforementioned minimum phase shift that the controller 120 may apply to the data signal DQS corresponds to the minimum bit shifting amount available in the architecture shown in FIG. 10.

Figure 11:
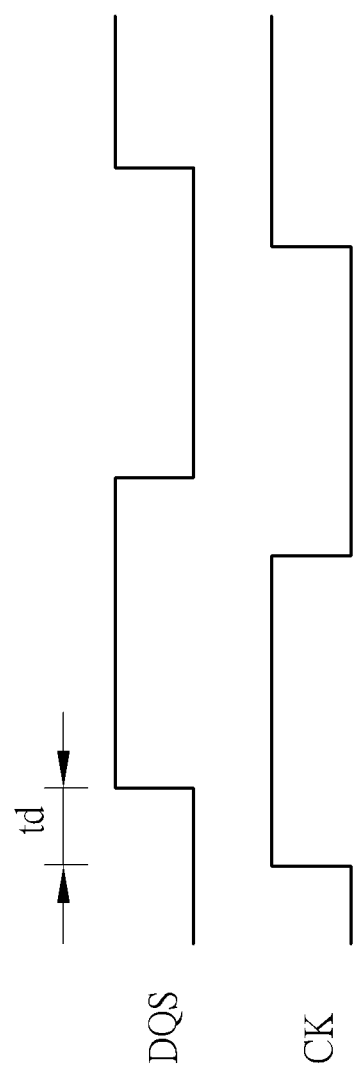
FIG. 11 illustrates the associated waveforms corresponding to the two series of bit streams shown in FIG. 10 according to an embodiment of the present invention.

FIG. 11 illustrates the associated waveforms corresponding to the two series of bit streams shown in FIG. 10 according to an embodiment of the present invention. According to this embodiment, in the bit shifting phase of the control scheme shown in FIG. 7, the controller 120 may apply the aforementioned at least one phase shift to the data signal DQS to make rising and falling edges of a pulse of the data signal DQS be closer to rising and falling edges of a pulse of the clock signal CK having the second frequency, respectively.

In comparison with the waveforms shown in FIG. 9, the speed that the clock signal CK switches between the logical states thereof can be kept the same as that in the embodiment shown in FIG. 9. In addition, in comparison with the waveforms shown in FIG. 9, the speed that the data signal DQS switches between the logical states thereof can be kept the same as that in the embodiment shown in FIG. 9, where the time when the first pulse of the two pulses of the data signal DQS appears is earlier than that of the embodiment shown in FIG. 9. For example, by adjusting the bit stream input into the memory interface module 122DQS, the controller 120 applies a phase shift within the aforementioned at least one phase shift (e.g. the phase shift corresponding to the bit shifting amount of one bit in the embodiment shown in FIG. 10) to the data signal DQS. Please note that, by adjusting the bit stream input into the memory interface module 122DQS, the controller 120 shifts the partial waveform of any of the pulses of the data signal DQS shown in FIG. 9 to appear earlier along the time axis in this embodiment.

Figure 12:
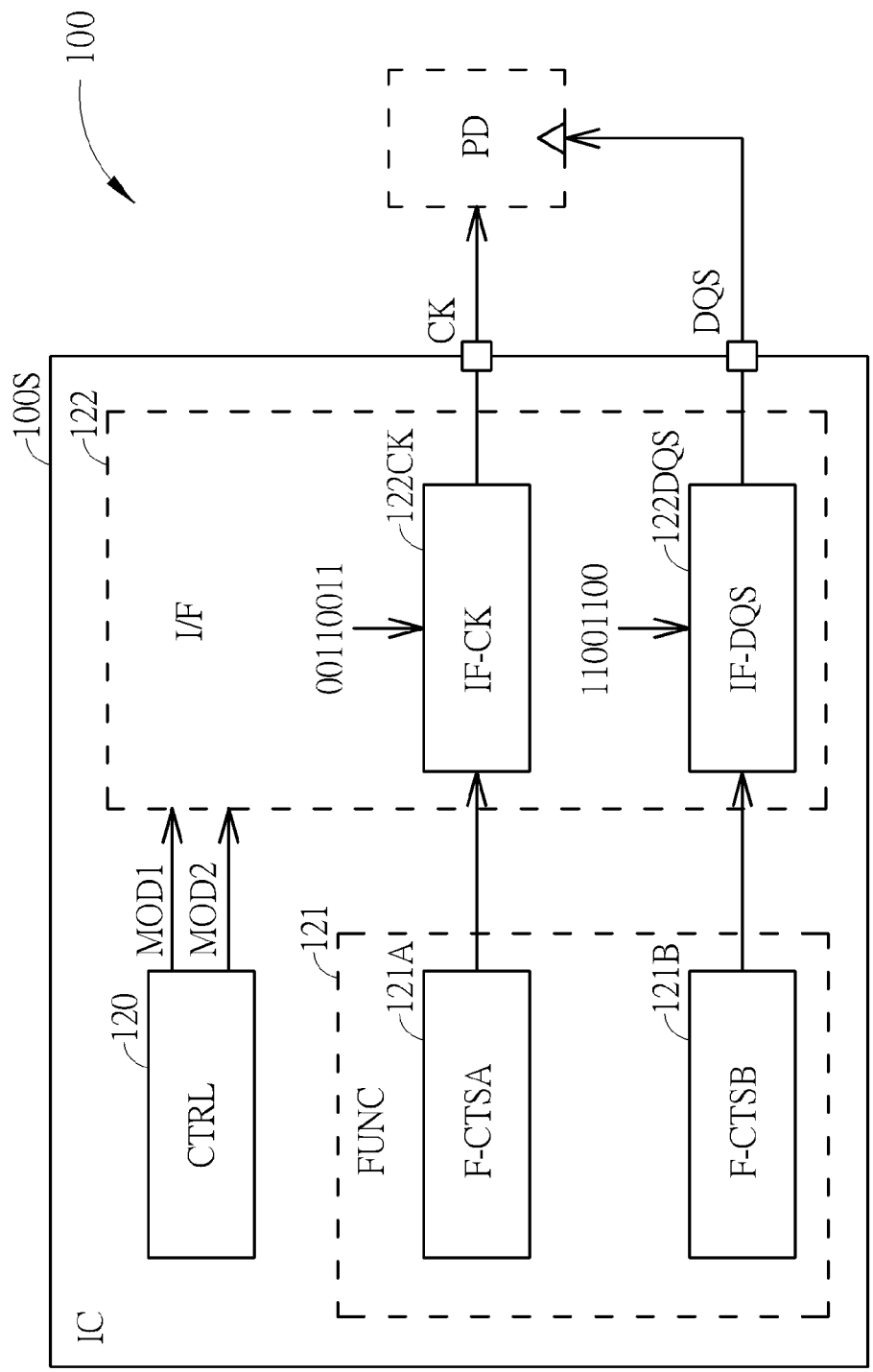
FIG. 12 illustrates two series of bit streams used in the bit shifting phase of the control scheme shown in FIG. 7 according to an embodiment of the present invention.

FIG. 12 illustrates two series of bit streams used in the bit shifting phase of the control scheme shown in FIG. 7 according to an embodiment of the present invention. For example, the first set of bits may comprise a series of bit stream such as the bit stream "00110011" input into the memory interface module 122CK shown in FIG. 12, and the second set of bits may comprise a series of bit stream such as the bit stream "11001100" input into the memory interface module 122DQS shown in FIG. 12.

According to this embodiment, the minimum phase shift that the controller 120 may apply to the data signal DQS can still be a UI, such as the aforementioned half of the period of the clock signal CK having the first frequency (e.g. the clock signal CK controlled with the bit stream "01010101" in the embodiment shown in FIG. 4, or the clock signal CK in the embodiment shown in FIG. 7). For example, the aforementioned at least one phase shift in Step 220 can be equivalent to a multiple of the half of the period of the clock signal CK having the first frequency, since there are at least two phase shift such as the phase shift of the embodiment shown in FIG. 10 and the phase shift of the embodiment shown in FIG. 12. More particularly, the aforementioned at least one phase shift in Step 220 may comprise a plurality of phase shifts such as the aforementioned at least two phase shifts, where each phase shift of the plurality of phase shifts can be equivalent to the half of the period of the clock signal CK having the first frequency.

In comparison with the architecture shown in FIG. 10, the bit stream input into the memory interface module 122CK in this embodiment can be kept the same. As a result, the speed that the memory interface module 122CK controls the variations of the logical states of the clock signal CK (e.g. the speed of switching the logical states of the clock signal CK) can be kept the same as that in the embodiment shown in FIG. 10. In addition, in comparison with the architecture shown in FIG. 10, the bit stream input into the memory interface module 122DQS in this embodiment comprises a data pattern having shifted bits of the original data pattern in the modulation signal MOD2 of the embodiment shown in FIG. 10, where the bit shifting amount is equal to one bit in this embodiment. As a result, the speed that the memory interface module 122DQS controls the variations of the logical states of the data signal DQS (e.g. the speed of switching the logical states of the data signal DQS) can be kept the same as that in the embodiment shown in FIG. 10, where the time when any of the two pulses of the data signal DQS appears can be changed, and more particularly, can be earlier than that in the embodiment shown in FIG. 10. Please note that the aforementioned minimum phase shift that the controller 120 may apply to the data signal DQS still corresponds to the minimum bit shifting amount available in the architecture shown in FIG. 12.

Figure 13:
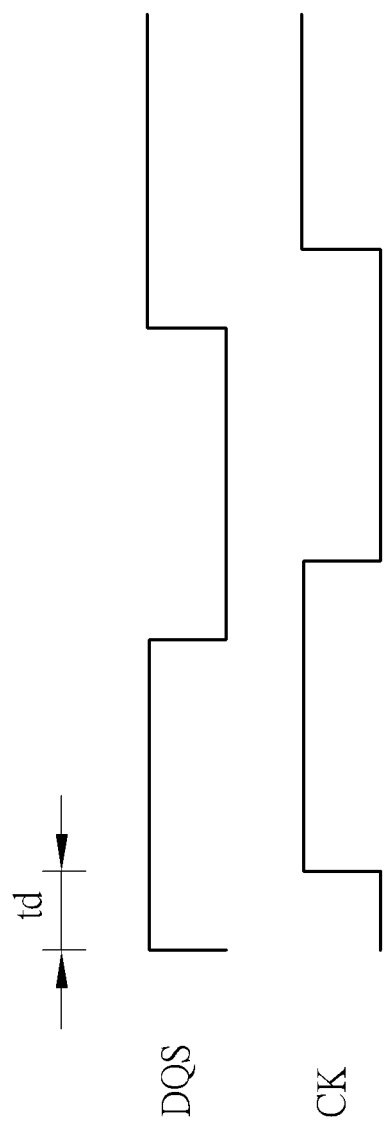
FIG. 13 illustrates the associated waveforms corresponding to the two series of bit streams shown in FIG. 12 according to an embodiment of the present invention.

FIG. 13 illustrates the associated waveforms corresponding to the two series of bit streams shown in FIG. 12 according to an embodiment of the present invention. According to this embodiment, in the bit shifting phase of the control scheme shown in FIG. 7, the controller 120 may apply the aforementioned at least one phase shift of Step 220 to the data signal DQS until a status of whether the data signal DQS leads or lags behind the clock signal CK is changed. For example, in comparison with the timing relationship shown in FIG. 11, the controller 120 may stop performing the coarse tuning operations (which may include the operations of the speed down phase and the bit shifting phase in this embodiment) when the clock signal CK lags behind the data signal DQS.

In comparison with the waveforms shown in FIG. 11, the speed that the clock signal CK switches between the logical states thereof can be kept the same as that in the embodiment shown in FIG. 11. In addition, in comparison with the waveforms shown in FIG. 11, the speed that the data signal DQS switches between the logical states thereof can be kept the same as that in the embodiment shown in FIG. 11, where the time when the first pulse of the two pulses of the data signal DQS appears is earlier than that of the embodiment shown in FIG. 11. For example, by adjusting the bit stream input into the memory interface module 122DQS, the controller 120 applies a phase shift within the aforementioned at least one phase shift (e.g. the phase shift corresponding to the bit shifting amount of one bit in the embodiment shown in FIG. 12) to the data signal DQS. Please note that, by adjusting the bit stream input into the memory interface module 122DQS, the controller 120 shifts the partial waveform of any of the pulses of the data signal DQS shown in FIG. 11 to appear earlier along the time axis in this embodiment.

Figure 14:
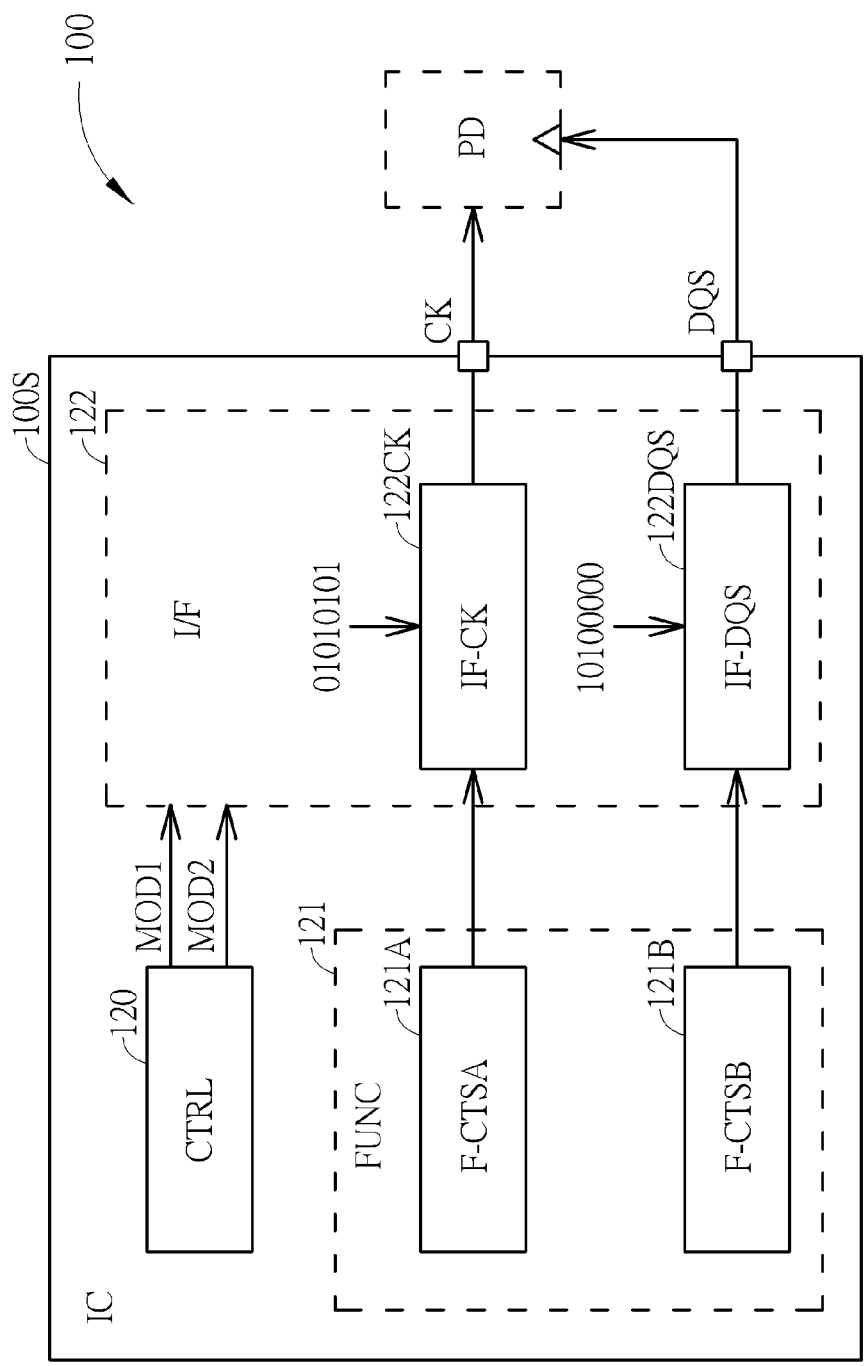
FIG. 14 illustrates two series of bit streams used in a speed up phase of the control scheme shown in FIG. 7 according to an embodiment of the present invention.

FIG. 14 illustrates two series of bit streams used in a speed up phase of the control scheme shown in FIG. 7 according to an embodiment of the present invention. For example, the first set of bits may comprise a series of bit stream such as the bit stream "01010101" input into the memory interface module 122CK shown in FIG. 14, and the second set of bits may comprise a series of bit stream such as the bit stream "10100000" input into the memory interface module 122DQS shown in FIG. 14.

In comparison with the architecture shown in FIG. 12, the bit stream input into the memory interface module 122CK in this embodiment comprises a data pattern having non-repeated bits (e.g. the non-additional bits that are not generated in the speed down phase, such as the bits that are not redundant before entering the speed down phase) of the previous data pattern in the modulation signal MOD1 of the embodiment shown in FIG. 12, and more particularly, comprises the same data pattern as that in the modulation signal MOD1 of the embodiment shown in FIG. 4 (i.e. the original data pattern in the modulation signal MOD1 of the embodiment shown in FIG. 4). As a result, the speed that the memory interface module 122CK controls the variations of the logical states of the clock signal CK (e.g. the speed of switching the logical states of the clock signal CK) becomes higher than that in the embodiment shown in FIG. 12, and more particularly, is the same as that in the embodiment shown in FIG. 4. In addition, in comparison with the architecture shown in FIG. 12, the bit stream input into the memory interface module 122DQS in this embodiment comprises a data pattern having non-repeated bits (e.g. the non-additional bits that are not generated in the speed down phase, such as the bits that are not redundant before entering the speed down phase) of the previous data pattern in the modulation signal MOD2 of the embodiment shown in FIG. 12, and more particularly, comprises a shifted version of the original data pattern in the modulation signal MOD2 of the embodiment shown in FIG. 4. As a result, the speed that the memory interface module 122DQS controls the variations of the logical states of the data signal DQS (e.g. the speed of switching the logical states of the data signal DQS) becomes higher than that in the embodiment shown in FIG. 12, and more particularly, is the same as that in the embodiment shown in FIG. 4.

Figure 15:
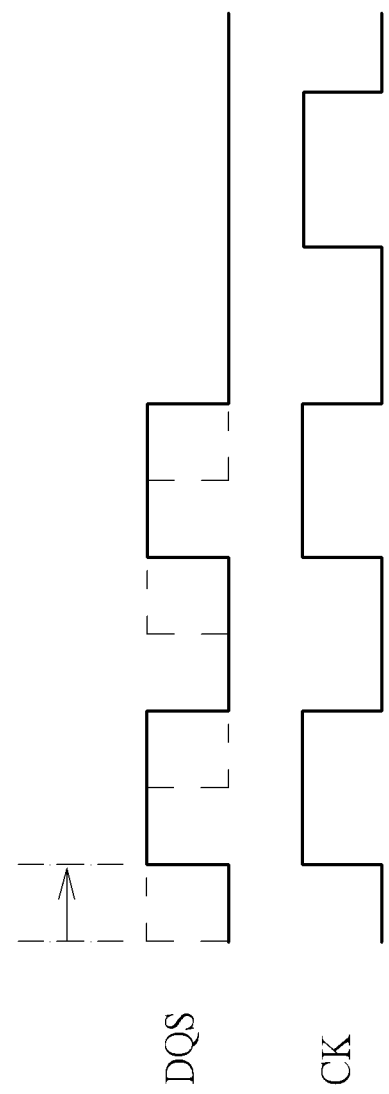
FIG. 15 illustrates the associated waveforms corresponding to the two series of bit streams shown in FIG. 14 according to an embodiment of the present invention.

FIG. 15 illustrates the associated waveforms corresponding to the two series of bit streams shown in FIG. 14 according to an embodiment of the present invention. In comparison with the waveforms shown in FIG. 13, the speed that the clock signal CK switches between the logical states thereof becomes higher than that in the embodiment shown in FIG. 13, and more particularly, is the double of that in the embodiment shown in FIG. 13. For example, by adjusting the bit stream input into the memory interface module 122CK, the controller 120 controls the clock signal CK to switch from the second frequency to the first frequency, where the first frequency is twice the second frequency in this embodiment.

Regarding the data signal DQS, please refer to the waveform illustrated with the dashed lines first, where this waveform of the data signal DQS is a shifted version of that in the embodiment shown in FIG. 7. In comparison with the waveforms shown in FIG. 13, the speed that the data signal DQS switches between the logical states thereof becomes higher than that in the embodiment shown in FIG. 13, and more particularly, is the double of that in the embodiment shown in FIG. 13. For example, by adjusting the bit stream input into the memory interface module 122DQS, the controller 120 shrinks the partial waveform of any of the two pulses of the data signal DQS shown in FIG. 13 with the shrinking factor along the time axis in this embodiment, where the shrinking factor is equivalent to the reciprocal of the enlarging factor, and more particularly, is equal to (1/2) in this embodiment. Please note that, by adjusting the bit stream input into the memory interface module 122CK, the controller 120 also shrinks the partial waveform of any of the pulses of the clock signal CK shown in FIG. 13 with the shrinking factor mentioned above along the time axis in this embodiment.

After performing the operations described from the embodiment shown in FIG. 7 through to the embodiment shown in FIG. 15, such as those of the speed down phase, the bit shifting phase, and the speed up phase of the control scheme shown in FIG. 7, the controller 120 can start using the aforementioned phase interpolator to perform the fine tuning operations on the data signal DQS, and more particularly, to tune the phase of the data signal DQS, where the other waveform of the data signal DQS in this embodiment, such as that illustrated with the non-dashed lines, can be taken as an example of the result of performing the fine tuning operations on the data signal DQS. As a result, the present invention method (e.g. the method 200) and the associated apparatus (e.g. the apparatus 100) can correctly perform timing alignment for paths having different lengths, and can guarantee the overall performance of the electronic device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing memory interface control of an electronic device, the method comprising the steps of:
when it is detected that a phase difference between a data signal and a clock signal reaches a predetermined value, controlling the clock signal to switch from a first frequency to a second frequency, wherein both of the clock signal and the data signal are signals of a memory interface circuit of the electronic device, and the memory interface circuit is arranged for controlling a random access memory (RAM) of the electronic device;
applying at least one phase shift to the data signal until a condition is satisfied, wherein the at least one phase shift is applied to the data signal after the clock signal switches from the first frequency to the second frequency; and
controlling the clock signal to switch from the second frequency to the first frequency, wherein the clock signal switches from the second frequency to the first frequency after the at least one phase shift is applied to the data signal;
wherein the memory interface circuit is calibrated with aid of the at least one phase shift.

2. The method of claim 1, wherein the first frequency is a multiple of the second frequency; and a ratio of the first frequency to the second frequency is equivalent to a positive integer that is greater than one.

3. The method of claim 1, further comprising:
when it is detected that the phase difference between the clock signal and the data signal reaches the predetermined value, enlarging a partial waveform of the data signal with an enlarging factor along a time axis;
wherein the at least one phase shift is applied to the data signal after the partial waveform of the data signal is enlarged with the enlarging factor along the time axis.

4. The method of claim 3, wherein the enlarging factor is equivalent to a ratio of the first frequency to the second frequency; and the ratio of the first frequency to the second frequency is equivalent to a positive integer that is greater than one.

5. The method of claim 3, further comprising:
shrinking an associated partial waveform of the data signal with a shrinking factor along the time axis, wherein the associated partial waveform corresponds to the partial waveform, and the shrinking factor is a reciprocal of the enlarging factor;
wherein the associated partial waveform of the data signal is shrunken with the shrinking factor along the time axis after the at least one phase shift is applied to the data signal.

6. The method of claim 5, wherein the partial waveform comprises at least two pulses corresponding to a data pattern carried by the data signal; the associated partial waveform comprises at least two pulses corresponding to an associated data pattern carried by the data signal; and the associated data pattern corresponds to the data pattern.

7. The method of claim 1, wherein the at least one phase shift is equivalent to (1/Ns) of a period of the clock signal having the first frequency, or equivalent to a multiple of said (1/Ns) of the period of the clock signal having the first frequency, where Ns represents a positive integer that is greater than one.

8. The method of claim 1, wherein the step of applying the at least one phase shift to the data signal further comprises:
applying the at least one phase shift to the data signal to make rising and falling edges of a pulse of the data signal be closer to rising and falling edges of a pulse of the clock signal having the second frequency, respectively.

9. The method of claim 1, wherein the step of applying the at least one phase shift to the data signal further comprises:
applying the at least one phase shift to the data signal until a status of whether the data signal leads or lags behind the clock signal is changed.

10. The method of claim 1, further comprising:
controlling whether to pull up or pull down the clock signal according to a modulation signal, wherein the modulation signal carries a set of bits; and
controlling whether to pull up or pull down the data signal according to another modulation signal, wherein the other modulation signal carries another set of bits.

11. The method of claim 10, wherein the step of controlling the clock signal to switch from the first frequency to the second frequency further comprises:
controlling the clock signal to switch from the first frequency to the second frequency by applying repeated bits to the modulation signal.

12. The method of claim 10, further comprising:
when it is detected that the phase difference between the clock signal and the data signal reaches the predetermined value, enlarging a partial waveform of the data signal with an enlarging factor along a time axis by applying repeated bits to the other modulation signal;
wherein the at least one phase shift is applied to the data signal after the partial waveform of the data signal is enlarged with the enlarging factor along the time axis.

13. The method of claim 12, wherein the step of applying the at least one phase shift to the data signal further comprises:
applying the at least one phase shift to the data signal by performing bit shifting on the other modulation signal.

14. The method of claim 10, further comprising:
calibrating the memory interface circuit by utilizing a bit shifting amount corresponding to the at least one phase shift as a parameter to be calibrated, wherein the bit shifting amount is applied to data carried by the data signal after calibration of the memory interface circuit.

15. The method of claim 10, further comprising:
calibrating the memory interface circuit by adjusting a length of a delay line of the memory interface circuit according to the at least one phase shift, wherein the length of the delay line corresponds to a number of delay units in the delay line that are kept enabled.

16. An apparatus for performing memory interface control of an electronic device, the apparatus comprising at least one portion of the electronic device, the apparatus comprising:
a memory interface circuit, positioned in an integrated circuit (IC) of the electronic device, arranged for controlling a random access memory (RAM) of the electronic device, wherein signals of the memory interface circuit comprises a clock signal and a data signal; and
a controller, coupled to the memory interface circuit and positioned in the IC, wherein when it is detected that a phase difference between the data signal and the clock signal reaches a predetermined value, the controller controls the clock signal to switch from a first frequency to a second frequency, and applies at least one phase shift to the data signal until a condition is satisfied, wherein the at least one phase shift is applied to the data signal after the clock signal switches from the first frequency to the second frequency, and the controller controls the clock signal to switch from the second frequency to the first frequency, wherein the clock signal switches from the second frequency to the first frequency after the at least one phase shift is applied to the data signal;
wherein the controller calibrates the memory interface circuit with aid of the at least one phase shift.

17. An apparatus for performing memory interface control of an electronic device, the apparatus comprising at least one portion of the electronic device, the apparatus comprising:
a plurality of clock buffer pairs, electrically connected in series and positioned in a memory interface circuit of an integrated circuit (IC) of the electronic device, wherein each clock buffer pair of the plurality of clock buffer pairs comprises two clock buffers that are arranged in different directions, one of the two clock buffers is positioned on an ordinary transmission path for distributing a reference clock signal of the IC toward a random access memory (RAM) of the electronic device, another of the two clock buffers is positioned on an extraordinary transmission path for being used as a route back path adjacent to the ordinary transmission path during calibration of the memory interface circuit, and an end of the ordinary transmission path is utilized as beginning of the extraordinary transmission path; and
a phase detector, coupled to the plurality of clock buffer pairs and positioned in the IC, arranged to perform phased detection on the reference clock signal obtained from the extraordinary transmission path, to calibrate the memory interface circuit according to distribution time of the reference clock signal.

18. The apparatus of claim 17, further comprising:
an analog delay line, coupled to a reference clock source of the reference clock signal and positioned at the beginning of the ordinary transmission path, arranged to delay the reference clock signal and output the delayed reference clock signal to a first clock buffer on the ordinary transmission path, wherein a length of the analog delay line is adjusted according to at least one phase detection result of the phase detector during calibration of the memory interface circuit, and the at least one phase detection result is measured with respect to the reference clock signal directly obtained from the reference clock source; and
another analog delay line, coupled to the phase detector and positioned at the end of the extraordinary transmission path, arranged to delay the reference clock signal obtained from a last clock buffer on the extraordinary transmission path.

19. The apparatus of claim 17, further comprising:
an analog delay line, coupled to a reference clock source of the reference clock signal and positioned at the beginning of the ordinary transmission path, arranged to delay the reference clock signal and output the delayed reference clock signal to a first clock buffer on the ordinary transmission path, wherein a length of the analog delay line is adjusted according to at least one phase detection result of the phase detector during calibration of the memory interface circuit, and the at least one phase detection result is measured with respect to an altered reference clock signal associated to an accumulator offset code; and another analog delay line, coupled to the phase detector and positioned at the end of the extraordinary transmission path, arranged to delay the reference clock signal obtained from a last clock buffer on the extraordinary transmission path.

20. The apparatus of claim 17, further comprising:

a direct digital synthesis (DDS) sub-module, coupled between a reference clock source of the reference clock signal and the beginning of the ordinary transmission path, arranged to perform a DDS operation on the reference clock signal to generate a DDS result and output the DDS result to a first clock buffer on the ordinary transmission path, wherein the DDS operation corresponds to at least one phase detection result of the phase detector during calibration of the memory interface circuit;

another DDS sub-module, coupled between the reference clock source of the reference clock signal and the phase detector, arranged to perform another DDS operation on the reference clock signal to generate another DDS result and output the other DDS result to the phase detector; and a calculation module, coupled between the DDS sub-module and the phase detector, arranged to perform calculations according to the at least one phase detection result to generate at least one calculation result, for altering the DDS operation performed by the DDS sub-module.

21. A method for performing memory interface control of an electronic device, the method comprising the steps of:

utilizing a plurality of clock buffer pairs to transmit a reference clock signal of an integrated circuit (IC) of the electronic device, the plurality of clock buffer pairs being electrically connected in series and positioned in a memory interface circuit of the IC, wherein each clock buffer pair of the plurality of clock buffer pairs comprises two clock buffers that are arranged in different directions, one of the two clock buffers is positioned on an ordinary transmission path for distributing the reference clock signal of the IC toward a random access memory (RAM) of the electronic device, another of the two clock buffers is positioned on an extraordinary transmission path for being used as a route back path adjacent to the ordinary transmission path during calibration of the memory interface circuit, and an end of the ordinary transmission path is utilized as beginning of the extraordinary transmission path; and utilizing a phase detector in the IC to perform phased detection on the reference clock signal obtained from the extraordinary transmission path, to calibrate the memory interface circuit according to distribution time of the reference clock signal.

* * * * *